(12) United States Patent
Okabe et al.

(10) Patent No.: US 12,101,974 B2
(45) Date of Patent: Sep. 24, 2024

(54) DISPLAY DEVICE

(71) Applicant: SHARP KABUSHIKI KAISHA, Sakai (JP)

(72) Inventors: Tohru Okabe, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 461 days.

(21) Appl. No.: 17/441,054

(22) PCT Filed: Mar. 28, 2019

(86) PCT No.: PCT/JP2019/013769
§ 371 (c)(1),
(2) Date: Sep. 20, 2021

(87) PCT Pub. No.: WO2020/194706
PCT Pub. Date: Oct. 1, 2020

(65) Prior Publication Data
US 2022/0216288 A1 Jul. 7, 2022

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC .......... H10K 59/1213; H10K 59/1216; H10K 59/124; H10K 59/131
See application file for complete search history.

(56) References Cited

U.S. PATENT DOCUMENTS

2018/0358572 A1 12/2018 Harada et al.
2021/0028269 A1* 1/2021 Lee ..................... H10K 50/15

FOREIGN PATENT DOCUMENTS

JP          2019-003720 A       1/2019

* cited by examiner

*Primary Examiner* — Tony Tran
(74) *Attorney, Agent, or Firm* — ScienBiziP, P.C.

(57) ABSTRACT

A TFT layer of a display device includes: an initialization power source wiring line; a second interlayer insulating film provided covering the initialization power source wiring line; a source wiring line provided on the second interlayer insulating film; a low-level power source wiring line provided below the initialization power source wiring line; and a frame capacitor. The frame capacitor includes: a first frame capacitance electrode formed by the same material in the same layer as the initialization power source wiring line; and a second frame capacitance electrode formed by the same material in the same layer as the source wiring line and facing the first frame capacitance electrode with the second interlayer insulating film interposed therebetween. The first frame capacitance electrode is electrically connected to the high-level power source wiring line, and the second frame capacitance electrode is electrically connected to the low-level power source wiring line.

19 Claims, 31 Drawing Sheets

DISPLAY DEVICE

TECHNICAL FIELD

The present disclosure relates to a display device.

BACKGROUND ART

In recent years, self-luminous type organic Electro Luminescence (hereinafter also referred to as EL) display devices using organic EL elements have attracted attention as display devices that can replace liquid crystal display devices. An organic EL element has a structure in which a first electrode and a second electrode face each other with an organic EL layer interposed therebetween. The organic EL element is provided for each of subpixels constituting a display region of an organic EL display device.

The organic EL display device includes a first power source wiring line electrically connected to a first electrode and a second power source wiring line electrically connected to a second electrode. In the organic EL display device, a current is applied between the first electrode and the second electrode of each organic EL element through the first power source wiring line and the second power source wiring line, and thus the organic EL layer is caused to emit light by each subpixel to display an image (see, for example, PTL 1).

CITATION LIST

Patent Literature

PTL 1: JP 2019-3720 A

SUMMARY

Technical Problem

Incidentally, in the organic EL display device, due to the first power source wiring line itself having resistance or supplying current to a pixel circuit provided in each corresponding subpixel, the potential of the first power source wiring line varies depending on a distance from a terminal portion that supplies a voltage to the wiring line, and a voltage drop phenomenon called an IR drop occurs in the first power source wiring line. The IR drop causes a decrease in luminance, particularly in the subpixels located farther from the terminal portion of the display region, leading to a decrease in display quality.

A technique of the present disclosure has been made in view of the above, and an object of the technique of the present disclosure is to suppress a decrease in luminance of subpixels due to IR drop and to improve display quality.

Solution to Problem

The technique of the present disclosure is directed to a display device including a base substrate, a TFT layer (a thin film transistor layer) including a plurality of thin film transistors (hereinafter referred to as "TFTs") provided on the base substrate, and a light-emitting element layer including a plurality of light-emitting elements provided on the TFT layer.

The display device according to the technique of the present disclosure is provided with a display region configured to display an image by light emission of light-emitting elements controlled by the action of the TFTs, and a frame region located on the periphery of the display region. The light-emitting element layer includes first electrodes provided for each of the plurality of light-emitting elements, light-emitting function layers provided on the first electrodes, and a second electrode provided on the light-emitting function layers in common to the plurality of light-emitting elements.

The TFT layer includes a first wiring line, a first interlayer insulating film provided covering the first wiring line, a second wiring line provided on the first interlayer insulating film, a second interlayer insulating film provided covering the second wiring line, and a third wiring line provided on the second interlayer insulating film. At least one wiring line of the first wiring line, the second wiring line, and the third wiring line constitutes a plurality of first power source wiring lines provided in the display region and electrically connected to the first electrodes via the plurality of thin film transistors, and a second power source wiring line provided in the frame region and electrically connected to the second electrode.

The frame region is provided with a terminal portion including terminals configured to supply a first power supply voltage to the plurality of first power source wiring lines and a second power supply voltage different from the first power supply voltage to the second power source wiring line, on one side of the display region. Furthermore, a capacitor is provided in the frame region along a side of the two sides facing the terminal portion in the display region, the side being one farther from the terminal portion.

The capacitor includes a first capacitance electrode formed by a same material in a same layer as the second wiring line, and a second capacitance electrode formed by a same material in a same layer as the third capacitance electrode, the second capacitance electrode facing the first capacitance electrode via the second interlayer insulating film. The first capacitance electrode is electrically connected to the plurality of first power source wiring lines. The second capacitance electrode is electrically connected to the second power source wiring line.

Advantageous Effects of Disclosure

According to the display device according to the technique of the present disclosure, a capacitor is provided in a portion of a frame region located on the opposite side to a terminal portion with a display region interposed therebetween, along a side of the display region farther from the terminal portion, and a first capacitance electrode of the capacitor is electrically connected to the first power source wiring line, and a second capacitance electrode of the capacitor is electrically connected to a second power source wiring line. Thus, when an IR drop occurs in the first power source wiring line, the charge can be compensated for from the capacitor to the first power source wiring line to compensate for the potential of the first power source wiring line. In this way, a voltage that drops by the IR drop in the voltage between a first electrode and a second electrode of an organic EL element can be compensated for. As a result, a decrease in luminance of subpixels due to the IR drop can be suppressed and display quality can be improved.

DESCRIPTION OF EMBODIMENTS

Exemplary embodiments will be described below in detail with reference to the drawings. In the following embodiments, an organic EL display device including an organic EL element will be described as an example of a display device according to a technique of the present disclosure.

Note that, in the following embodiments, a description that a constituent element such as a film, layer, element, or the like is provided or formed on another constituent element such as another film, layer, element, or the like means not only a case where a constituent element is provided directly on another constituent element, but also a case where, between a constituent element and another constituent element, still another constituent element such as still another film, layer, element, or the like is interposed.

In the following embodiments, a description that a constituent element such as a film, layer, element, or the like is connected to another constituent element such as another film, layer, element, or the like means that a constituent element is electrically connected to another constituent element unless otherwise specifically stated, and in a scope not departing from the gist of the technique of the present disclosure, includes not only a case meaning a direct connection but also a case meaning an indirect connection through still another constituent element such as still another film, layer, element, or the like, and may also include a case where a constituent element is integrated into another component element, that is, a part of a constituent component constitutes another constituent component.

In the following embodiments, the description of "the same layer" refers to a film or a layer formed through the same process as in the film or the layer to be compared, the description of "a lower layer" refers to a film, a layer, or an element formed in a process before a process in which the film, the layer, or the element to be compared is formed, and the description of "an upper layer" refers to a film or a layer formed in a process after the process in which the film or the layer to be compared is formed.

First Embodiment

Figure 1:
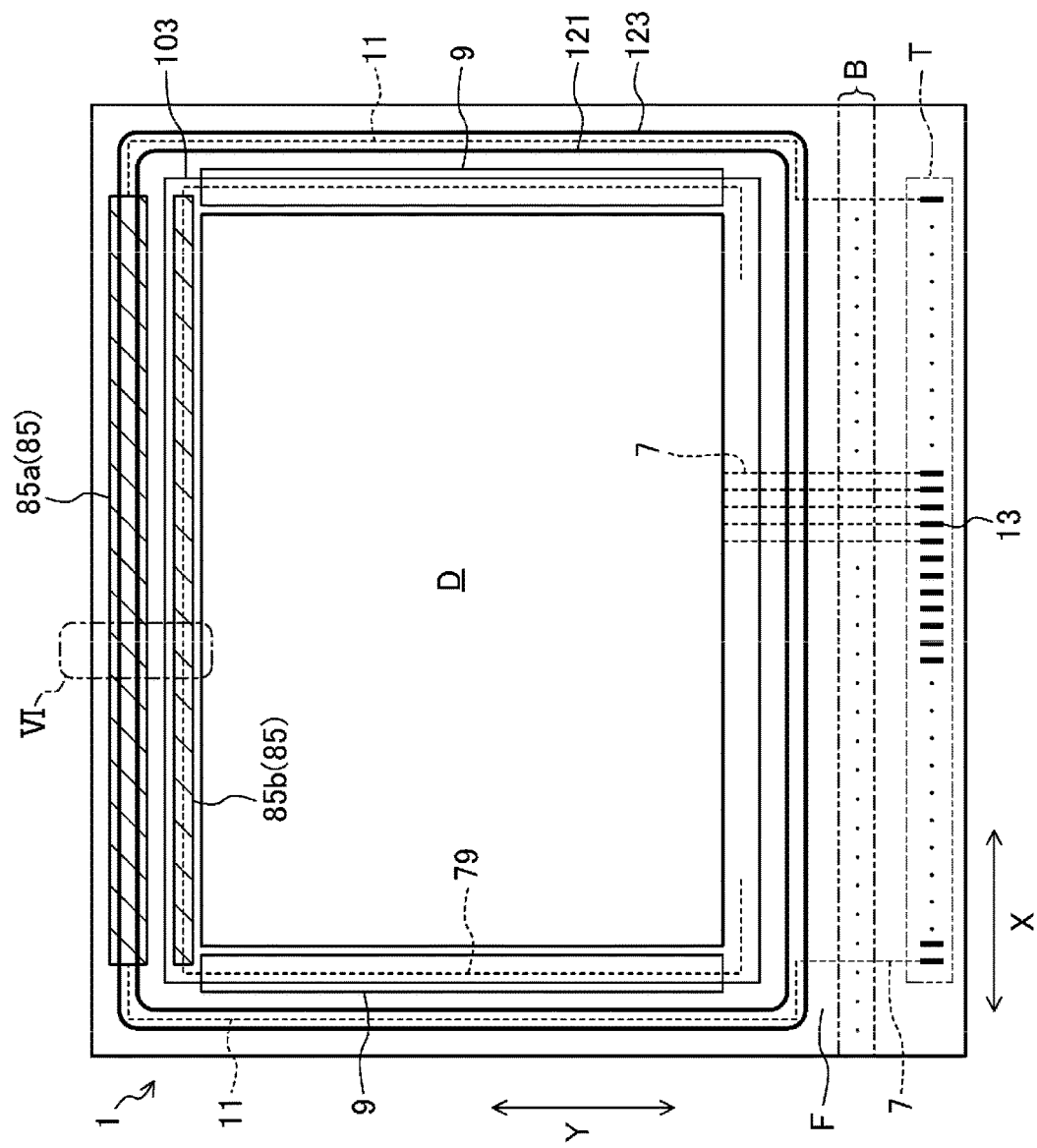
FIG. 1 is a plan view illustrating a schematic configuration of an organic EL display device according to a first embodiment.
Figure 2:
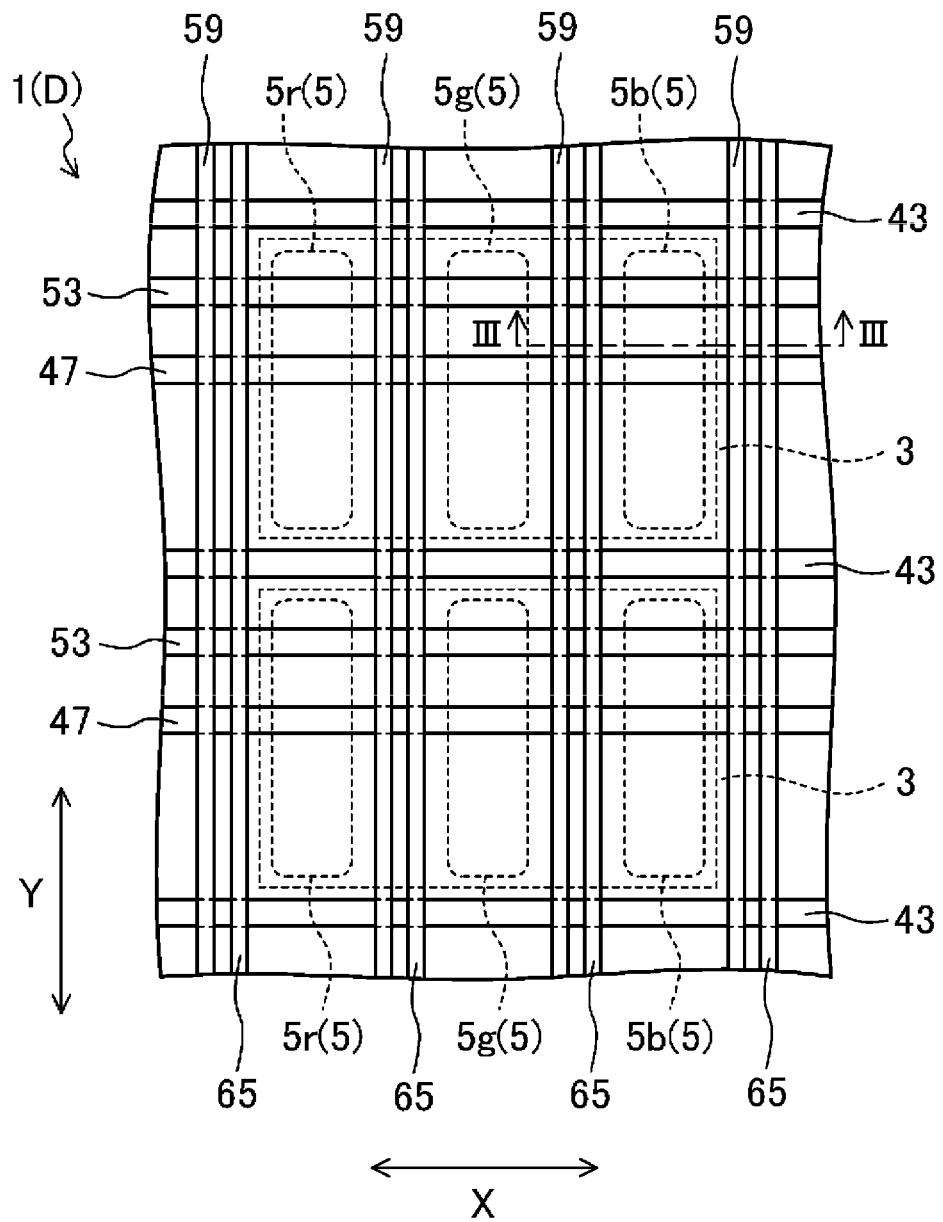
FIG. 2 is a plan view illustrating a configuration of a display region of the organic EL display device according to the first embodiment.
Figure 3:
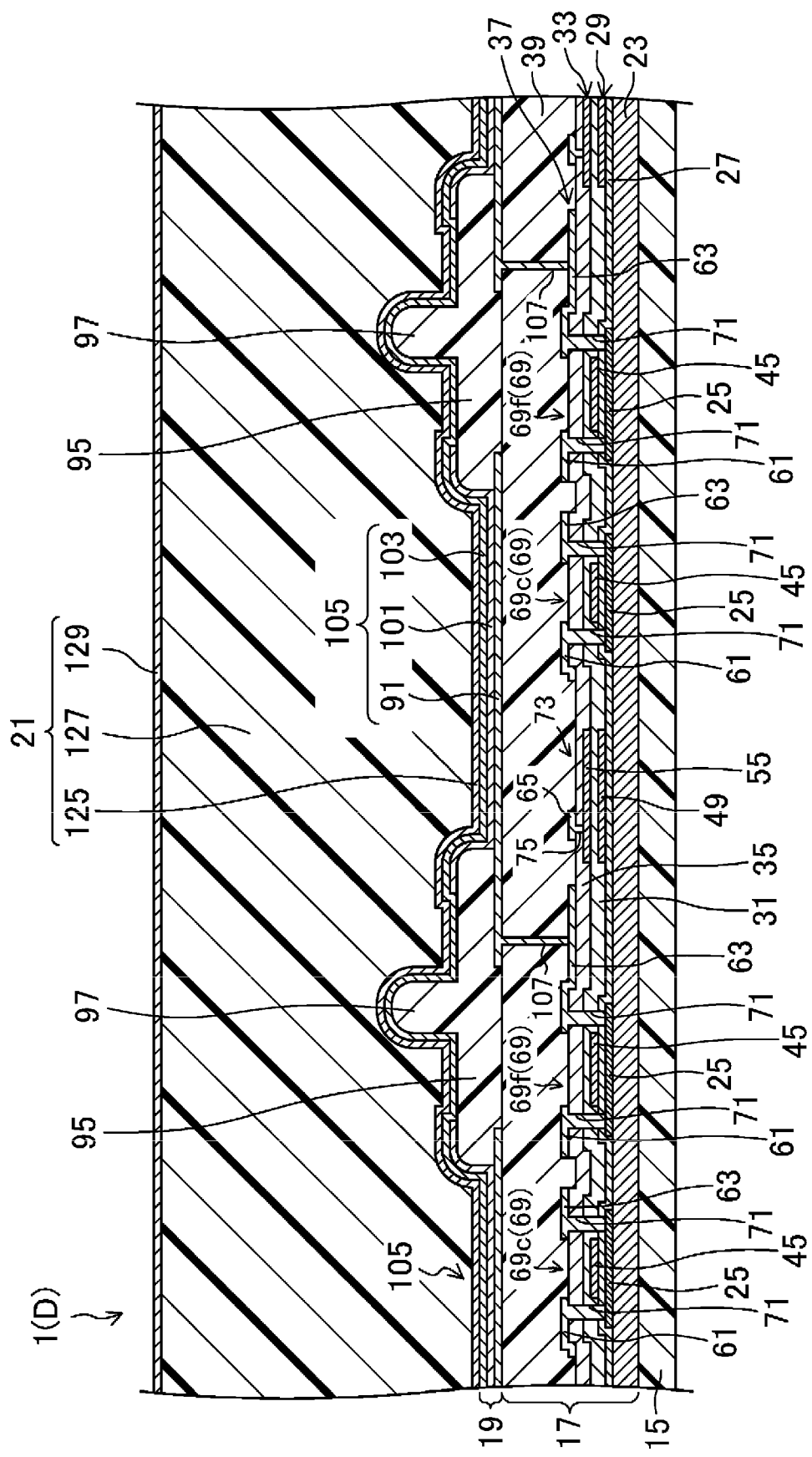
FIG. 3 is a cross-sectional view of the organic EL display device taken along the line III-III in FIG. 2.
Figure 4:
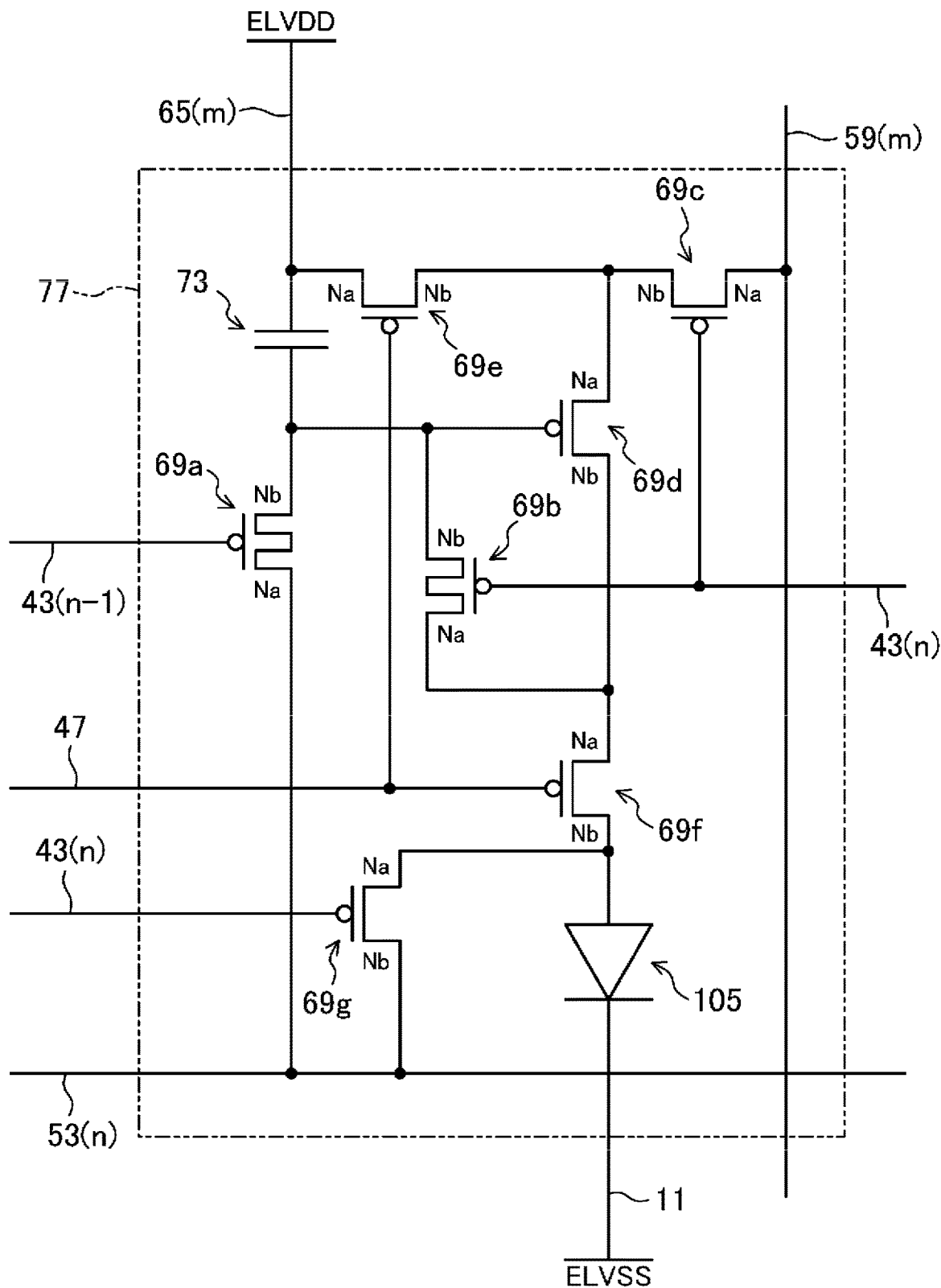
FIG. 4 is an equivalent circuit diagram illustrating a pixel circuit of the organic EL display device according to the first embodiment.
Figure 5:
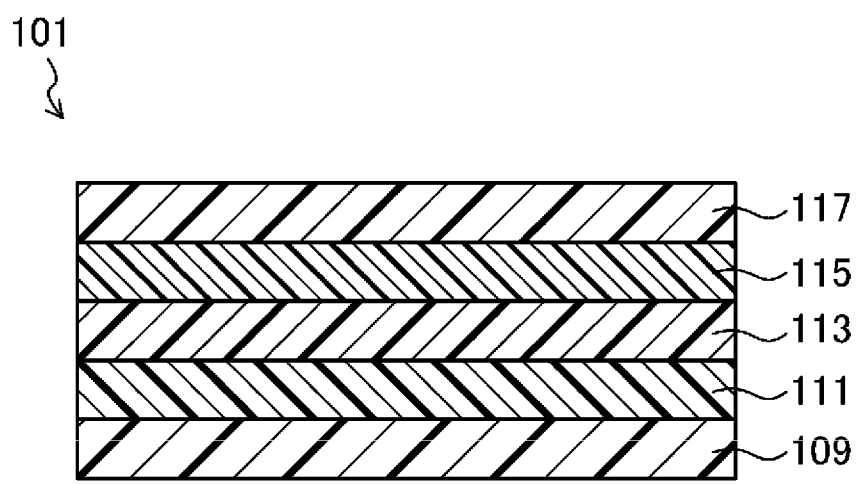
FIG. 5 is a cross-sectional view illustrating a layered structure of an organic EL layer constituting the organic EL display device according to the first embodiment.
Figure 6:
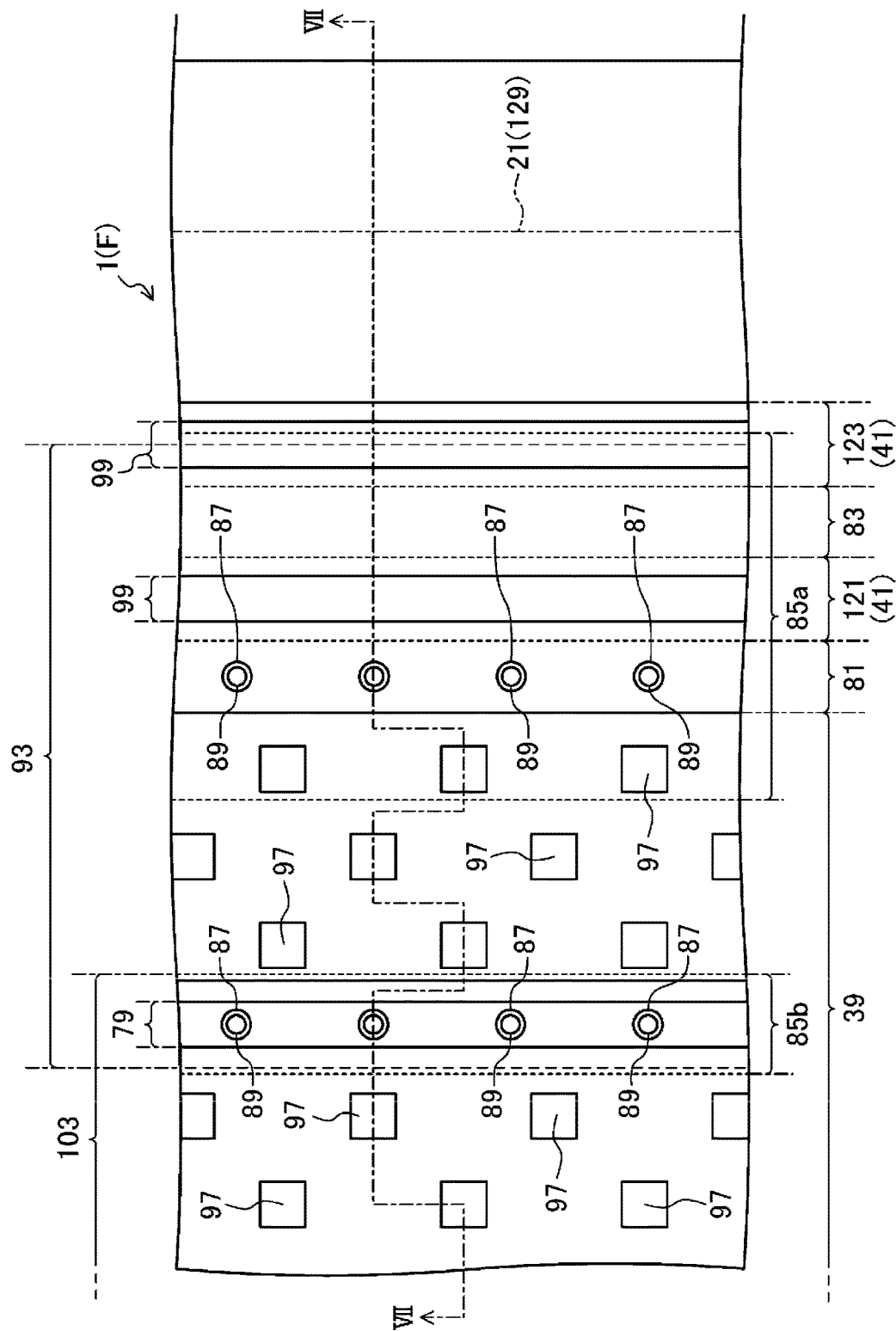
FIG. 6 is a plan view illustrating a configuration of a frame region of the organic EL display device, the frame region being surrounded by VI in FIG. 1.
Figure 7:
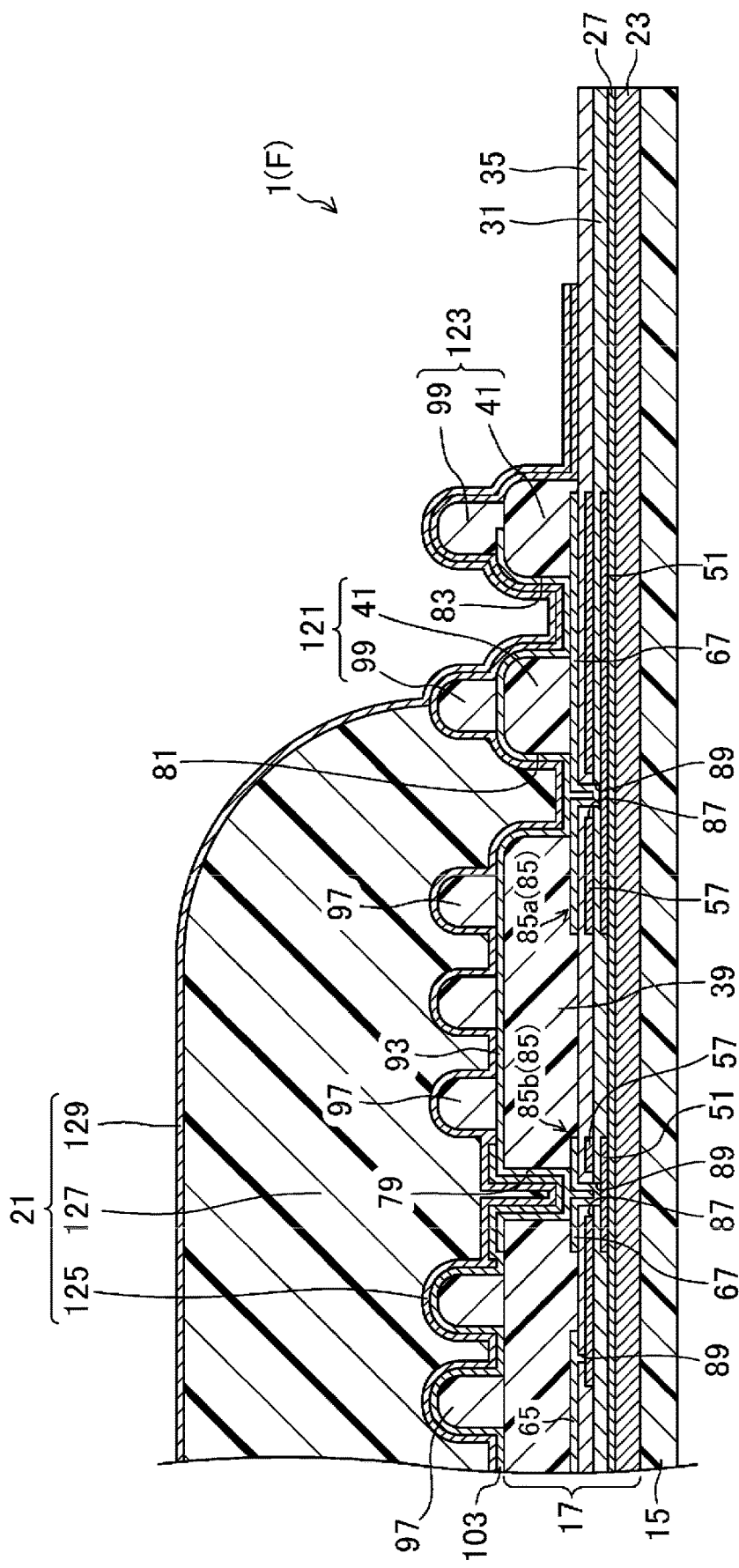
FIG. 7 is a cross-sectional view of the organic EL display device taken along the line VII-VII in FIG. 6.

FIG. 1 to FIG. 7 illustrate a first embodiment of a display device according to the technique of the present disclosure. Note that FIG. 1 is a plan view illustrating a schematic configuration of an organic EL display device 1 according to the first embodiment. FIG. 2 is a plan view illustrating a configuration of a display region D of the organic EL display device 1. FIG. 3 is a cross-sectional view of the organic EL display device 1 taken along the line III-III in FIG. 2. FIG. 4 is an equivalent circuit diagram illustrating a pixel circuit 77 of the organic EL display device 1. FIG. 5 is a cross-sectional view illustrating a layered structure of an organic EL layer 101 constituting the organic EL display device 1 according to the first embodiment. FIG. 6 is a plan view illustrating a configuration of a frame region F of the organic EL display device 1, the frame region being surrounded by VI in FIG. 1. FIG. 7 is a cross-sectional view of the organic EL display device 1 taken along the line VII-VII in FIG. 6.

Configuration of Organic EL Display Device

As illustrated in FIG. 1, the organic EL display device 1 includes the display region D configured to display an image and a frame region F provided on the periphery of the display region D.

The display region D is a rectangular region constituting the screen, and includes a plurality of pixels 3 as illustrated in FIG. 2. The plurality of pixels 3 are arranged in a matrix shape, for example. For example, each of the pixels 3 includes three subpixels 5 composed of a subpixel 5r for emitting light of a red color, a subpixel 5g for emitting light of a green color, and a subpixel 5b for emitting light of a blue color. The three subpixels 5 are arranged in a stripe shape, for example.

Note that in the first embodiment, the display region D having the rectangular shape is exemplified, but the "rectangular shape" here includes, for example, a substantial rectangular shape such as a rectangular shape whose sides are arc-shaped, a rectangular shape whose corners are arc-shaped, and a rectangular shape in which a part of a side has a notch.

The frame region F is a rectangular frame-shaped region constituting a non-display portion other than the screen. A terminal portion T to be connected to an external circuit is provided in a portion constituting one side of the frame region F. A bending portion B that is bendable with a first direction X, which is the horizontal direction in FIG. 1, as the bending axis, is provided between the display region D and the terminal portion T in the frame region F.

The terminal portion T is disposed on the back side of the organic EL display device 1 by the frame region F being bent, for example, by 180° (in a U shape) at a bending portion B. The terminal portion T is connected to a wiring line substrate such as a Flexible Printed Circuit (FPC). A plurality of lead-out wiring lines 7 drawn from the display region D to the terminal portion T are provided in the frame region F.

In the frame region F, a drive circuit 9 including a gate driver, an emission driver, and the like is monolithically provided in a portion that constitutes sides adjacent to the side where the terminal portion T is provided with (both left and right sides in FIG. 1). A low-level power source wiring line 11 is provided in the frame region F. The low-level power source wiring line 11 is also drawn toward the terminal portion T to form a lead-out wiring line 7.

A plurality of wiring line terminals 13 for conducting communication with the lead-out wiring lines 7 provided in the frame region F are provided in a predetermined pattern in the terminal portion T. The organic EL display device 1 is connected to a high level voltage power supply (ELVDD), a low level voltage power supply (ELVSS), and a display control circuit via the wiring line substrate by the plurality of wiring line terminals 13.

The organic EL display device 1 employs an active matrix driving method in which light emission from each subpixel 5 is controlled by a TFT 69 and an image is displayed by the action of the TFT 69. As illustrated in FIG. 3, the organic EL display device 1 includes a resin substrate layer 15, a TFT layer 17 provided on the resin substrate layer 15, a light-emitting element layer 19 provided on the TFT layer 17, and a sealing film 21 provided on the light-emitting element layer 19.

Configuration of Substrate Resin Layer

The resin substrate layer 15 is an example of a base substrate and has flexibility. The resin substrate layer 15 is formed of, for example, an organic material such as a polyimide resin, a polyamide resin, or an epoxy resin. The resin substrate layer 15 may be composed of a layered film of an inorganic insulating layer made of an inorganic material such as silicon oxide (SiOx), silicon nitride (SiNy), silicon oxynitride (SiOxNy) (x and y are positive numbers, the same applies hereinafter), and the resin layer described above.

Configuration of TFT Layer

The TFT layer 17 includes a base coat film 23, a semiconductor layer 25, a gate insulating film 27, a first conductive layer 29, a first interlayer insulating film 31, a second conductive layer 33, a second interlayer insulating film 35, a third conductive layer 37, a flattening film 39, and a first wall layer 41, which are sequentially provided on the resin substrate layer 15.

The first conductive layer 29 includes a plurality of gate wiring lines 43, a plurality of gate electrodes 45, a plurality of emission control wiring lines 47, a plurality of first pixel capacitance electrodes 49, and two third frame capacitance electrodes 51. The gate wiring lines 43, the gate electrodes 45, the emission control wiring lines 47, the first pixel capacitance electrodes 49, and the third frame capacitance electrodes 51 are formed by the same material in the same layer.

The gate wiring lines 43, the gate electrodes 45, the emission control wiring lines 47, the first pixel capacitance electrodes 49, and the third frame capacitance electrodes 51 are formed of a single-layer film or a layered film of a metal layer of, for example, aluminum (Al), tungsten (W), molybdenum (Mo), tantalum (Ta), chromium (Cr), titanium (Ti), copper (Cu), or the like. The gate wiring lines 43 and the emission control wiring lines 47 are examples of the first wiring line.

The second conductive layer 33 includes a plurality of initialization power source wiring lines 53, a plurality of second pixel capacitance electrodes 55, and two first frame capacitance electrodes 57. The initialization power source wiring line 53, the second pixel capacitance electrode 55, and the first frame capacitance electrode 57 are formed by the same material in the same layer.

The initialization power source wiring line 53, the second pixel capacitance electrode 55, and the first frame capacitance electrode 57 are formed of a single-layer film or a layered film of a metal layer of, for example, aluminum (Al), tungsten (W), molybdenum (Mo), tantalum (Ta), chromium (Cr), titanium (Ti), copper (Cu), or the like. The initialization power source wiring line 53 is an example of the second wiring line.

The third conductive layer 37 includes a plurality of source wiring lines 59, a plurality of source electrodes 61, a plurality of drain electrodes 63, a plurality of high-level power source wiring lines 65, a low-level power source wiring line 11, and two second frame capacitance electrodes 67. The source wiring lines 59, the source electrodes 61, the drain electrodes 63, the high-level power source wiring lines 65, the low-level power source wiring line 11, and the second frame capacitance electrodes 67 are formed by the same material in the same layer.

The source wiring lines 59, the source electrodes 61, the drain electrodes 63, the high-level power source wiring lines 65, the low-level power source wiring line 11, and the second frame capacitance electrodes 67 are formed of a single-layer film or a layered film of a metal layer of, for example, aluminum (Al), tungsten (W), molybdenum (Mo), tantalum (Ta), chromium (Cr), titanium (Ti), copper (Cu), or the like. The source wiring lines 59, the high-level power source wiring lines 65, and the low-level power source wiring line 11 are examples of the third wiring line.

The plurality of gate wiring lines 43 are provided in the display region D and extend parallel to each other in the first direction X. The gate wiring lines 43 are each a wiring line configured to transmit a gate signal and provided for each row of the subpixels 5. The gate wiring lines 43 are each connected to a gate driver included in the drive circuit 9, and are sequentially selected at a predetermined timing to change to an active state.

A plurality of emission control wiring lines 47 are provided in the display region D and extend parallel to each other in the first direction X. The emission control wiring lines 47 are each a wiring line configured to transmit an emission control signal and provided for each row of the subpixels 5. The emission control wiring lines 47 are each connected to the emission driver included in the drive circuit 9, and are sequentially selected at a predetermined timing to change to an inactive state.

The plurality of initialization power source wiring lines 53 are provided in the display region D and extend parallel to each other in the first direction X. The initialization power source wiring lines 53 are each a wiring line configured to impart an initialization potential and provided for each row of the subpixels 5. The initialization power source wiring lines 53 are each drawn from the display region D to the terminal portion T as the lead-out wiring line 7 and connected to the initialization voltage power supply via the wiring line substrate at the terminal portion T.

The plurality of source wiring lines 59 are provided in the display region D and extend parallel to each other in a second direction Y, which is the vertical direction in FIG. 1 orthogonal to the first direction X. The source wiring lines 59 are each a wiring line configured to carry a source signal and provided for each column of the subpixels 5. The source wiring lines 59 are each drawn from the display region D to the terminal portion T as the lead-out wiring line 7 and connected to the display control circuit via the wiring line substrate at the terminal portion T.

The plurality of high-level power source wiring lines 65 are provided in the display region D and extend parallel to each other in the second direction Y. The high-level power source wiring lines 65 are each a wiring line configured to impart a predetermined high level potential and provided for each column of the subpixels 5. Each of the high-level power source wiring lines 65 is drawn from the display region D to the terminal portion T as the lead-out wiring line 7, and is connected to the high level voltage power supply (ELDVV) via the wiring line substrate at the terminal portion T. The high-level power source wiring line 65 is supplied with a high level power supply voltage that is a first power supply voltage from the high level voltage power supply (ELDVV) through the terminal portion T. The high-level power source wiring line 65 is one example of the first power source wiring line.

Each of the high-level power source wiring lines 65 may be constituted by a combination of a first high-level power source wiring line extending in the first direction X and a second high-level power source wiring line extending in the second direction. In this case, the first high-level power source wiring line is included in the second conductive layer 33, and constitutes the second wiring line. The second high-level power source wiring line is included in the third conductive layer 37, and constitutes the third wiring line. The first high-level power source wiring line and the second high-level power source wiring line are connected via a contact hole formed in the second interlayer insulating film 35.

The low-level power source wiring line 11 extends in the frame region F on both sides in the first direction X of the display region D, and is provided between the display region D and a second dam wall 123, which will be described later. The low-level power source wiring line 11 is a wiring line configured to impart a predetermined low-level potential, and is provided in common to the plurality of subpixels 5 and formed in the same manner as the second frame capacitance electrode 67 of a first frame capacitor 85a, which will be described later. The low-level power source wiring line 11 is drawn to the terminal portion T, and is connected to the low level voltage power supply (ELVSS) via the wiring line substrate at the terminal portion T. The low-level power source wiring line 11 is supplied with a low level power supply voltage that is a second power supply voltage different from the high level power supply voltage through the terminal portion T. The low-level power source wiring line 11 is one example of the second power source wiring line.

The semiconductor layer 25, the gate insulating film 27, the gate electrode 45, the first interlayer insulating film 31, the second interlayer insulating film 35, the source electrode 61, and the drain electrode 63 constitute the TFT 69.

The semiconductor layer 25 is provided in an island shape. The semiconductor layer 25 is formed of a Low Temperature Polycrystalline Silicon (LTPS), an In—Ga—Zn—O based oxide semiconductor, or the like, for example.

The gate insulating film 27 is provided so as to cover the semiconductor layer 25. The gate insulating film 27 is formed of a single-layer film or a layered film of an inorganic insulating layer of, for example, silicon oxide (SiOx), silicon nitride (SiNy), silicon oxynitride (SiOxNy), or the like.

Each of the gate electrodes 45 is provided so as to overlap a part (channel region) of the semiconductor layer 25 with the gate insulating film 27 interposed therebetween. The gate electrode 45 is connected to the gate wiring line 43 of the corresponding subpixel 5.

The first interlayer insulating film 31 is provided so as to cover the gate wiring line 43, the gate electrode 45, the emission control wiring line 47, the first pixel capacitance electrode 49, and the third frame capacitance electrode 51. The second interlayer insulating film 35 is provided so as to cover the initialization power source wiring line 53, the second pixel capacitance electrode 55, and the first frame capacitance electrode 57 on the first interlayer insulating film 31. Each of the first interlayer insulating film 31 and the second interlayer insulating film 35 is formed of a single-layer film or a layered film of an inorganic insulating film of, for example, silicon oxide (SiOx), silicon nitride (SiNy), silicon oxynitride (SiOxNy), or the like.

The source electrode 61 and the drain electrode 63 are separated from each other. The source electrode 61 and the drain electrode 63 are connected to respective different portions (source region and drain region) at locations between which a region of the semiconductor layer 25 overlapping with the gate electrode 45 is interposed, via a contact hole 71 formed in the gate insulating film 27, the first interlayer insulating film 31, and the second interlayer insulating film 35. The source electrode 61 is connected to the source wiring line 59 of the corresponding subpixel 5.

A plurality of TFTs 69 are provided for each of the subpixels 5. In other words, the TFT layer 17 includes the plurality of TFTs 69.

The plurality of TFTs 69 provided for each of the subpixels 5 includes a first TFT 69a, a second TFT 69b, a third TFT 69c, a fourth TFT 69d, a fifth TFT 69e, a sixth TFT 69f, and a seventh TFT 69g. These first to seventh TFTs 69a, 69b, 69c, 69d, 69e, 69f, and 69g employ the top gate structure described above, and are, for example, P-channel type TFTs.

The first pixel capacitance electrode 49, the first interlayer insulating film 31, and the second pixel capacitance electrode 55 constitute a pixel capacitor 73. At least one pixel capacitor 73 is provided for each of the subpixels 5.

The first pixel capacitance electrode 49 is connected to three TFTs 69 (first TFT 69a, second TFT 69b, and fourth TFT 69d) of the plurality of TFTs 69 provided in the subpixel 5. The second pixel capacitance electrode 55 is provided so as to face the first pixel capacitance electrode 49 with the first interlayer insulating film 31 interposed therebetween. The second pixel capacitance electrode 55 is connected to the high-level power source wiring line via a contact hole 75 formed in the second interlayer insulating film 35.

The first TFT 69a, the second TFT 69b, the third TFT 69c, the fourth TFT 69d, the fifth TFT 69e, the sixth TFT 69f, the seventh TFT 69g, and the pixel capacitor 73 constitute the pixel circuit 77 illustrated in FIG. 4. In each of the TFTs 69a, 69b, 69c, 69d, 69e, 69f, and 69g, the gate electrode 45 corresponds to a control terminal, one electrode of the source electrode 61 and the drain electrode 63 corresponds to a first conduction terminal Na, and the other electrode corresponds to a second conduction terminal Nb.

Note that the pixel circuit 77 illustrated in FIG. 4 is a pixel circuit 77 in the n-th row and m-th column (n and m are positive integers). In FIG. 4, the source wiring line 59 and the high-level power source wiring line 65 to which the reference sign (m) is added are the source wiring line 59 and the high-level power source wiring line 65 corresponding to the subpixels 5 in the m-th row. The gate wiring line 43, the emission control wiring line 47, and the initialization power source wiring line 53 to which the reference sign (n) is added are the gate wiring line 43, the emission control wiring line 47, and the initialization power source wiring line 53 corresponding to the subpixels 5 in the n-th column, and the gate wiring line 43 to which the reference sign (n−1) is added is a gate wiring line 43 that is scanned immediately before the gate wiring line corresponding to the subpixel 5 in the n-th row.

The first TFT 69a is a first initialization TFT provided between the gate wiring line 43, the initialization power source wiring line 53, and the pixel capacitor 73. In the first TFT 69a, the control terminal is connected to the gate wiring line 43, the first conduction terminal Na is connected to the initialization power source wiring line 53, and the second conduction terminal Nb is connected to the first pixel capacitance electrode 49 of the pixel capacitor 73. The gate wiring line 43 to which the control terminal of the first TFT 69a is connected is the gate wiring line 43 that is scanned immediately before the gate wiring line 43 of the corresponding subpixel 5. The first TFT 69a is configured to initialize a voltage on the control terminal of the fourth TFT 69d by applying a voltage of the initialization power source wiring line 53 to the pixel capacitor 73 in response to a selection of the gate wiring line 43.

The second TFT 69b is a threshold value compensation TFT provided between the gate wiring line 43 and the fourth TFT 69d. In the second TFT 69b, the control terminal is connected to the gate wiring line 43, the first conduction terminal Na is connected to the second conduction terminal Nb of the fourth TFT 69d, and the second conduction terminal Nb is connected to the control terminal of the fourth TFT 69d. The second TFT 69b is configured to compensate for the threshold voltage of the fourth TFT 69d by setting the fourth TFT 69d in a diode-connected state in response to a selection of the gate wiring line 43.

The third TFT 69c is a writing TFT provided between the gate wiring line 43, the source wiring line 59, and the fourth TFT 69d. In the third TFT 69c, the control terminal is connected to the gate wiring line 43, the first conduction terminal Na is connected to the source wiring line 59, and the second conduction terminal Nb is connected to the first conduction terminal Na of the fourth TFT 69d. The third TFT 69c is configured to apply a voltage of the source wiring line 59 to the first conduction terminal Na of the fourth TFT 69d in response to a selection of the gate wiring line 43.

The fourth TFT 69d is a drive TFT provided between the first TFT 69a, the second TFT 69b, the pixel capacitor 73, the third TFT 69c, the fifth TFT 69e, and the sixth TFT 69f. The control terminal of the fourth TFT 69d is connected to the second conduction terminal Nb of the second TFT 69b and is connected to the first pixel capacitance electrode 49 of the pixel capacitor 73. The first conduction terminal Na of the fourth TFT 69d is connected to the second conduction terminal Nb of the third TFT 69c and is connected to the second conduction terminal Nb of the fifth TFT 69e. The second conduction terminal Nb of the fourth TFT 69d is connected to the first conduction terminal Na of the second TFT 69b and is connected to the first conduction terminal Na of the sixth TFT 69f. The fourth TFT 69d is configured to apply a drive current corresponding to the voltage between the control terminal and the first conduction terminal Na to the first conduction terminal Na of the sixth TFT 69f.

The fifth TFT 69e is a power supply TFT provided between the emission control wiring line 47, the high-level power source wiring line 65, and the fourth TFT 69d. In the fifth TFT 69e, the control terminal is connected to the emission control wiring line 47, the first conduction terminal Na is connected to the high-level power source wiring line 65, and the second conduction terminal Nb is connected to the first conduction terminal Na of the fourth TFT 69d. The fifth TFT 69e is configured to apply a voltage (high level power supply voltage) of the high-level power source wiring line 65 to the first conduction terminal Na of the fourth TFT 69d in response to a selection of the emission control wiring line 47.

The sixth TFT 69f is a light emission control TFT provided between the emission control wiring line 47, the second TFT 69b, the fourth TFT 69d, and the organic EL element 105. In the sixth TFT 69f, the control terminal is connected to the emission control wiring line 47, the first conduction terminal Na is connected to the second conduction terminal Nb of the fourth TFT 69d, and the second conduction terminal Nb is connected to the first electrode 91 of the organic EL element 105. The sixth TFT 69f is configured to apply a drive current to the organic EL element 105 in response to a selection of the emission control wiring line 47.

The seventh TFT 69g is a second initialization TFT provided between the gate wiring line 43, the initialization power source wiring line 53, and the organic EL element 105. In the seventh TFT 69g, the control terminal is connected to the gate wiring line 43, the first conduction terminal Na is connected to the initialization power source wiring line 53, and the second conduction terminal Nb is connected to the first electrode 91 of the organic EL element 105. The seventh TFT 69g is configured to reset a charge accumulated in the first electrode 91 of the organic EL element 105 in response to a selection of the gate wiring line 43.

The pixel capacitor 73 is a data holding element provided between the high-level power source wiring line 65, the first TFT 69a, and the fourth TFT 69d. The first pixel capacitance electrode 49 of the pixel capacitor 73 is connected to the control terminal of the fourth TFT 69d, and is connected to the second conduction terminal Nb of the first TFT 69a and the second conduction terminal Nb of the second TFT 69b. The second pixel capacitance electrode 55 of the pixel capacitor 73 is connected to the high-level power source wiring line 65. The pixel capacitor 73 is charged by the voltage of the source wiring line 59 when the gate wiring line 43 is in the select state, and holds the voltage written by way of the charging to maintain the voltage applied to the control terminal of the fourth TFT 69d when the gate wiring line 43 is in the non-select state.

In the display region D, the flattening film 39 covers portions other than a part of the drain electrode 63 of the sixth TFT 69f (such as the source wiring line 59, the source electrode 61, other drain electrode 63, the high-level power source wiring line 65, and the second frame capacitance electrode 67), thereby flattening the surface of the TFT layer 17 so as to reduce steps due to the surface shapes of the first TFT 69a, the second TFT 69b, the third TFT 69c, the fourth TFT 69d, the fifth TFT 69e, the sixth TFT 69f, and the seventh TFT 69g. The flattening film 39 is formed of an organic material such as a polyimide resin, for example.

A trench 79 is formed in a portion of the flattening film 39 between the display region D and the outer circumferential end (first slit 81). The trench 79 extends through the flattening film 39 and is provided so as to surround the display region with a portion that constitutes three sides of the frame region, excluding one side of the terminal portion side. The trench 79 extends along the outer periphery of the display region D, and has a role of partitioning the flattening film 39 into an inner side and an outer side of the frame region F to prevent moisture or the like from entering the display region D.

Two first wall layers 41 are provided on the outer periphery of the flattening film 39 in the frame region F. Each of the first wall layers 41 is formed in a rectangular frame-like shape extending on the entire periphery of the flattening film 39. The two first wall layers 41 have similar figures and are arranged so as to be spaced apart from each other in the width direction of the frame region F. Each of the first wall layers 41 is formed by the same material in the same layer as the flattening film 39.

A first slit 81 that exposes the lower layer (second frame capacitance electrode 67) than the flattening film 39 is formed in a frame shape between the first wall layer 41 located on the inside and the flattening film 39. A second slit 83 that exposes the lower layer (second frame capacitance electrode 67) than the flattening film 39 is formed in a frame shape between the two first wall layers 41.

As illustrated in FIG. 7, the third frame capacitance electrode 51, the first interlayer insulating film 31, the first frame capacitance electrode 57, the second interlayer insulating film 35, and the second frame capacitance electrode 67 constitute a frame capacitor 85.

The third frame capacitance electrode 51 is provided in an island shape. The first frame capacitance electrode 57 is provided so as to face the third frame capacitance electrode 51 with the first interlayer insulating film 31 interposed therebetween. The second frame capacitance electrode 67 is provided so as to face the third frame capacitance electrode 51 with the second interlayer insulating film 35 interposed therebetween.

As illustrated in FIG. 1, two frame capacitors 85 are provided in a portion of the frame region F that constitutes a side located on the opposite side to the terminal portion T with the display region D interposed therebetween, along a side of two sides facing the terminal portion T in the display region D, the side being the one farther from the terminal portion T (hatched portion in FIG. 1). The two frame capacitors 85 are a first frame capacitor 85a and a second frame capacitor 85b.

As illustrated in FIG. 6 and FIG. 7, the first frame capacitor 85a is disposed on the outer periphery of the flattening film 39. Each of the third frame capacitance electrode 51, the first frame capacitance electrode 57, and the second frame capacitance electrode 67 that constitute the first frame capacitor 85a is provided in a region spanning from a position corresponding to the outer circumferential end portion of the flattening film 39 to a position overlapping with the first wall layer 41 located on the outer side. In this way, the first frame capacitor 85a is disposed at a position corresponding to the first slit 81 and also at a position corresponding to the second slit 83.

The first frame capacitance electrode 57 of the first frame capacitor 85a is connected to the high-level power source wiring line 65, although not illustrated. A first opening 87 that extends through the first frame capacitance electrode 57 is formed in the first frame capacitance electrode 57. The second frame capacitance electrode 67 of the first frame capacitor 85a is connected to the low-level power source wiring line 11.

The third frame capacitance electrode 51 of the first frame capacitor 85a is connected to the second frame capacitance electrode 67 via a first contact hole 89 formed in the first interlayer insulating film 31 and the second interlayer insulating film 35 inside the first opening 87. The first contact hole 89 is located at a position corresponding to the first slit 81 together with the first opening 87, and a plurality of the first contact holes 89 are formed at intervals from each other along the side of the display region D.

The second frame capacitor 85b is disposed at a position corresponding to the trench 79. Each of the third frame capacitance electrode 51, the first frame capacitance electrode 57, and the second frame capacitance electrode 67 that constitute the second frame capacitor 85b is provided at a position corresponding to the trench 79 and in regions on both sides thereof. In this way, the second frame capacitor 85b is disposed at a position corresponding to the trench 79.

The first frame capacitance electrode 57 of the second frame capacitor 85b is connected to the high-level power source wiring line 65 via the contact hole 89 formed in the first interlayer insulating film 31. A first opening 87 that extends through the first frame capacitance electrode 57 is formed in the first frame capacitance electrode 57. The second frame capacitance electrode 67 of the second frame capacitor 85b is connected to the second frame capacitance electrode 67 of the first frame capacitor 85a via the intermediate conductive film 93 included in the light-emitting element layer 19.

The third frame capacitance electrode 51 of the second frame capacitor 85b is connected to the second frame capacitance electrode 67 via a first contact hole 89 formed in the first interlayer insulating film 31 and the second interlayer insulating film 35 inside the first opening 87. The first contact hole 89 is located at a position corresponding to the trench 79 together with the first opening 87, and a plurality of the first contact holes 89 are formed at intervals from each other along the side of the display region.

Configuration of Light-Emitting Element Layer

As illustrated in FIG. 3, the light-emitting element layer 19 is provided on the flattening film 39. The light-emitting element layer 19 includes a first electrode 91 and an intermediate conductive film 93, an edge cover 95, a photo spacer 97 and a second wall layer 99, an organic EL layer 101, and a second electrode 103, which are sequentially provided on the flattening film 39.

The first electrode 91, the organic EL layer 101, and second electrode 103 constitute the organic EL element 105. The organic EL element 105 is provided for each of the subpixels 5. In other words, the light-emitting element layer 19 includes a plurality of organic EL elements 105. The organic EL element 105 is an example of a light-emitting element. The organic EL element 105 employs a top-emitting type structure, for example.

The first electrode 91 is provided in each of the subpixels 5. The first electrode 91 is connected to the drain electrode 63 of the sixth TFT 69f in the corresponding subpixel 5 via a contact hole 107 formed in the flattening film 39. The first electrode 91 functions as an anode electrode for injecting holes into the organic EL layer 101, and has light reflectivity.

Examples of materials of the first electrode 91 include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn).

Examples of the materials of the first electrode 91 may include alloy such as astatine (At)-astatine oxide ($AtO_2$). Furthermore, examples of the materials of the first electrode 91 may include electrically conductive oxide such as tin oxide (SnO), zinc oxide (ZnO), indium tin oxide (ITO), and indium zinc oxide (IZO).

It is further preferable that the first electrode 91 be formed of a material having a large work function to improve the efficiency of hole injection into the organic EL layer 101. The first electrode 91 may be formed by layering a plurality of layers formed of any of the materials described above.

The organic EL layer 101 is provided on each of the first electrodes 91. The organic EL layer 101 is an example of a light-emitting function layer. As illustrated in FIG. 5, the organic EL layer 101 includes a hole injection layer 109, a hole transport layer 111, a light-emitting layer 113, an electron transport layer 115, and an electron injection layer 117, which are sequentially provided on the first electrode 91.

The hole injection layer 109 is also referred to as an anode electrode buffer layer, and functions to reduce the energy level difference between the first electrode 91 and the organic EL layer 101, to improve the efficiency of hole injection into the organic EL layer 101 from the first electrode 91. Examples of a material of the hole injection layer 109 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative, and the like.

The hole transport layer 111 functions to migrate holes to the light-emitting layer 113 efficiently. Examples of a material of the hole transport layer 111 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 113 functions to recombine the holes injected from the first electrode 91 and the electrons injected from the second electrode 103 and emit light in a case that a voltage is applied by the first electrode 91 and the second electrode 103. The light-emitting layer 113 is formed of a material that varies in accordance with a luminescent color (for example, red, green, or blue) of the organic EL element 105 in the individual subpixel 5, for example.

Examples of a material of the light-emitting layer 113 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane and the like.

The electron transport layer 115 functions to facilitate migration of electrons to the light-emitting layer 113 efficiently. Examples of a material of the electron transport layer 115 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, a metal oxinoid compound, and the like as an organic compound.

The electron injection layer 117 is also referred to as a cathode electrode buffer layer, and functions to reduce the energy level difference between the second electrode 103 and the organic EL layer 101, to improve the electron injection efficiency into the organic EL layer 101 from the second electrode 103. Examples of a material of the electron injection layer 117 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

The second electrode 103 is provided and shared by the plurality of subpixels 5. The second electrode 103 covers the organic EL layer 101 and the edge cover 95, and overlaps with the first electrode 91 with the organic EL layer 101 interposed therebetween. The second electrode 103 functions as a cathode electrode for injecting electrons into the organic EL layer 101, and has optical transparency.

Examples of a material of the second electrode 103 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF).

The second electrode 103 may be formed of an alloy such as magnesium (Mg)-copper (Cu), magnesium (Mg)-silver (Ag), sodium (Na)-potassium (K), astatine (At)-astatine oxide (AtO2), lithium (Li)-aluminum (Al), lithium (Li)-calcium (Ca)-aluminum (Al), lithium fluoride (LiF)-calcium (Ca)-aluminum (Al) and the like, for example.

The second electrode 103 may be formed of electrically conductive oxide, such as tin oxide (SnO), zinc oxide (ZnO), indium tin oxide (ITO), and indium zinc oxide (IZO), for example. It is further preferable that the second electrode 103 be formed of a material having a small work function to improve the efficiency of electron injection into the organic EL layer 101. The second electrode 103 may be formed by layering a plurality of layers formed of any of the materials described above.

The edge cover 95 partitions the first electrodes 91 of adjacent subpixels 5. The edge cover 95 is formed in a lattice pattern as a whole and covers the outer circumferential end portion of each of the first electrodes 91. Examples of a material of the edge cover 95 include an organic material of, for example, a polyimide resin, an acrylic resin, a polysiloxane resin, a novolak resin, and the like.

A part of the surface of the edge cover 95 protrudes upward to form a photo spacer 119. As illustrated in FIG. 6 and FIG. 7, the photo spacer 119 is also provided in the frame region F. A second wall layer 99 is provided on each of the first wall layers 41. The edge cover 95, the photo spacer 119, and the second wall layer 99 are formed by the same material in the same layer.

The layered body of the first wall layer 41 and the second wall layer 99 located on the inside constitute a first dam wall 121. The layered body of the first wall layer 41 and the second wall layer 99 located on the outer side constitute a second dam wall 123. The first dam wall 121 and the second dam wall 123 have a role of holding back the expansion of the organic material to the outer side of the frame region F in a case of applying the organic material that forms the organic sealing layer 127 that constitutes the sealing film 21 during the manufacturing process of the organic EL display device 1. It can be said that the first slit 81 is formed between the flattening film 39 and the first dam wall 121. It can be said that the second slit 83 is formed between the first dam wall 121 and the second dam wall 123.

The intermediate conductive film 93 is formed by the same material in the same layer as the first electrode 91. The intermediate conductive film 93 is provided in the frame region F in a region spanning from the flattening film 39 through the first slit 81 and the second slit 83 to the second dam wall 123. The intermediate conductive film 93 is located between the first wall layer 41 and the second wall layer 99 that constitute the first dam wall 121 and between the first wall layer 41 and the second wall layer 99 that constitute the second dam wall 123.

The intermediate conductive film 93 is connected to and in contact with the second frame capacitance electrode 67 of the first frame capacitor 85a inside the first slit 81 and inside the second slit 83. Furthermore, the intermediate conductive film 93 is provided on the flattening film 39 from the side closer to the display region D than the trench 79 to the outer side of the flattening film 39 than the trench 79. The intermediate conductive film 93 covers the inner face of the trench 79 and is connected to and in contact with the second frame capacitance electrode 67 of the second frame capacitor 85b exposed inside the trench 79.

The second electrode 103 is provided on the flattening film 39 from the outer side of the flattening film 39 than the trench 79 to the side closer to the display region D than the trench 79. The second electrode 103 covers the inner face of the trench 79 with the intermediate conductive film 93, and is connected to and in contact with the intermediate conductive film 93 inside the trench 79. In this way, the intermediate conductive film 93 is in contact with the second electrode 103 between the display region D and the first slit 81.

The second frame capacitance electrode 67 and the third frame capacitance electrode 51 of the first frame capacitor 85a are connected to the intermediate conductive film 93 inside the first slit 81 and inside the second slit 83, and is connected to the second electrode 103 via the intermediate conductive film 93. The second electrode 103 is connected to the low-level power source wiring line 11 via the second frame capacitance electrode 67 of the first frame capacitor 85a. The first frame capacitor 85a stores charge corresponding to a potential difference between the high-level power source wiring line 65 and the low-level power source wiring line 11 between the first frame capacitance electrode 57 and the second frame capacitance electrode 67 and between the first frame capacitance electrode 57 and the third frame capacitance electrode 51.

The second frame capacitance electrode 67 and the third frame capacitance electrode 51 of the second frame capacitor 85b are connected to the second electrode 103 via the intermediate conductive film 93 inside the trench 79. The second frame capacitance electrode 67 and the third frame capacitance electrode 51 are connected to the second frame capacitance electrode 67 of the first frame capacitor 85a via the intermediate conductive film 93, and is connected to the low-level power source wiring line 11 via the second frame capacitance electrode 67. The second frame capacitor 85b also stores charge corresponding to a potential difference between the high-level power source wiring line 65 and the low-level power source wiring line 11 between the first frame capacitance electrode 57 and the second frame capacitance electrode 67 and between the first frame capacitance electrode 57 and the third frame capacitance electrode 51.

Configuration of Sealing Film

The sealing film 21 is provided so as to cover each of the organic EL elements 105, and has a function of protecting the organic EL layer 101 of each of the organic EL elements 105 from moisture, oxygen, and the like. The sealing film 21 includes a first inorganic sealing layer 125 provided so as to cover the second electrode 103, an organic sealing layer 127 provided on the first inorganic sealing layer 125, and a second inorganic sealing layer 129 provided on the organic sealing layer 127.

The first inorganic sealing layer 125 and the second inorganic sealing layer 129 are formed, for example, from an inorganic material such as silicon oxide (SiO2), aluminum oxide (Al2O3), silicon nitride (SiNx) like trisilicon tetranitride (Si3N4), and silicon carbonitride (SiCN). The organic sealing layer 127 is formed of, for example, an organic material such as acrylic resin, polyurea resin, parylene resin, polyimide resin, and polyamide resin.

Display Action of Organic EL Display Device

In the organic EL display device 1 having the configuration described above, the organic EL element 105 is brought into a non-light emission state when the emission control wiring line 47 is selected to be in the inactive state in each of the subpixels 5. In this state, when the gate wiring line 43 that is scanned immediately before the gate wiring line 43 of the subpixel 5 is selected, and the gate signal is input to the first TFT 69a via the gate wiring line 43, the first TFT 69a and the fourth TFT 69d brought into the on state, and the voltage of the initialization power source wiring line 53 is applied to the pixel capacitor 73. As a result, the charge of the pixel capacitor 73 is discharged, and the voltage applied to the gate electrode 45 of the fourth TFT 69d is initialized.

Next, when the gate wiring line 43 is selected to be in the active state, the second TFT 69b and the third TFT 69c are brought into the on state, a predetermined voltage corresponding to the source signal transmitted via the source wiring line 59 is written to the pixel capacitor 73 via the fourth TFT 69d in the diode-connected state, and the seventh TFT 69g is brought into the on state, and then, the voltage of the initialization power source wiring line 53 is applied to the first electrode 91 of the organic EL element 105, and the charge accumulated in the first electrode 91 is reset. Thereafter, the emission control wiring line 47 is brought into the activated state, the fifth TFT 69e and the sixth TFT 69f are brought into the on state, and the drive current corresponding to the voltage applied to the gate electrode 45 of the fourth TFT 69d is supplied from the high-level power source wiring line 65 to the organic EL element 105. As a result, the organic EL element 105 emits light at a luminance corresponding to the drive current, and the image display is performed.

According to the organic EL display device 1 according to the first embodiment, the first frame capacitor 85a and the second frame capacitor 85b are provided in a portion of the frame region F located on the opposite side to the terminal portion T with the display region D interposed therebetween, along a side of the display region D farther from the terminal portion T, and the first frame capacitance electrode 57 of each of the first frame capacitor 85a and the second frame capacitor 85b is electrically connected to the high-level power source wiring line 65, and the second frame capacitance electrode 67 and the third frame capacitance electrode 51 are electrically connected to the low-level power source wiring line 11. Thus, when an IR drop occurs in the high-level power source wiring line 65, the charge can be compensated for from the first frame capacitor 85a and the second frame capacitor 85b to the high-level power source wiring line 65 to compensate for the potential of the high-level power source wiring line 65. In this way, the voltage that drops by the IR drop in the voltage between the first electrode 91 and the second electrode 103 of the organic EL element 105 can be compensated for. As a result, the decrease in luminance of the subpixels 5 due to the IR drop can be suppressed, and the display quality can be improved.

First Modification Example of First Embodiment

Figure 8:
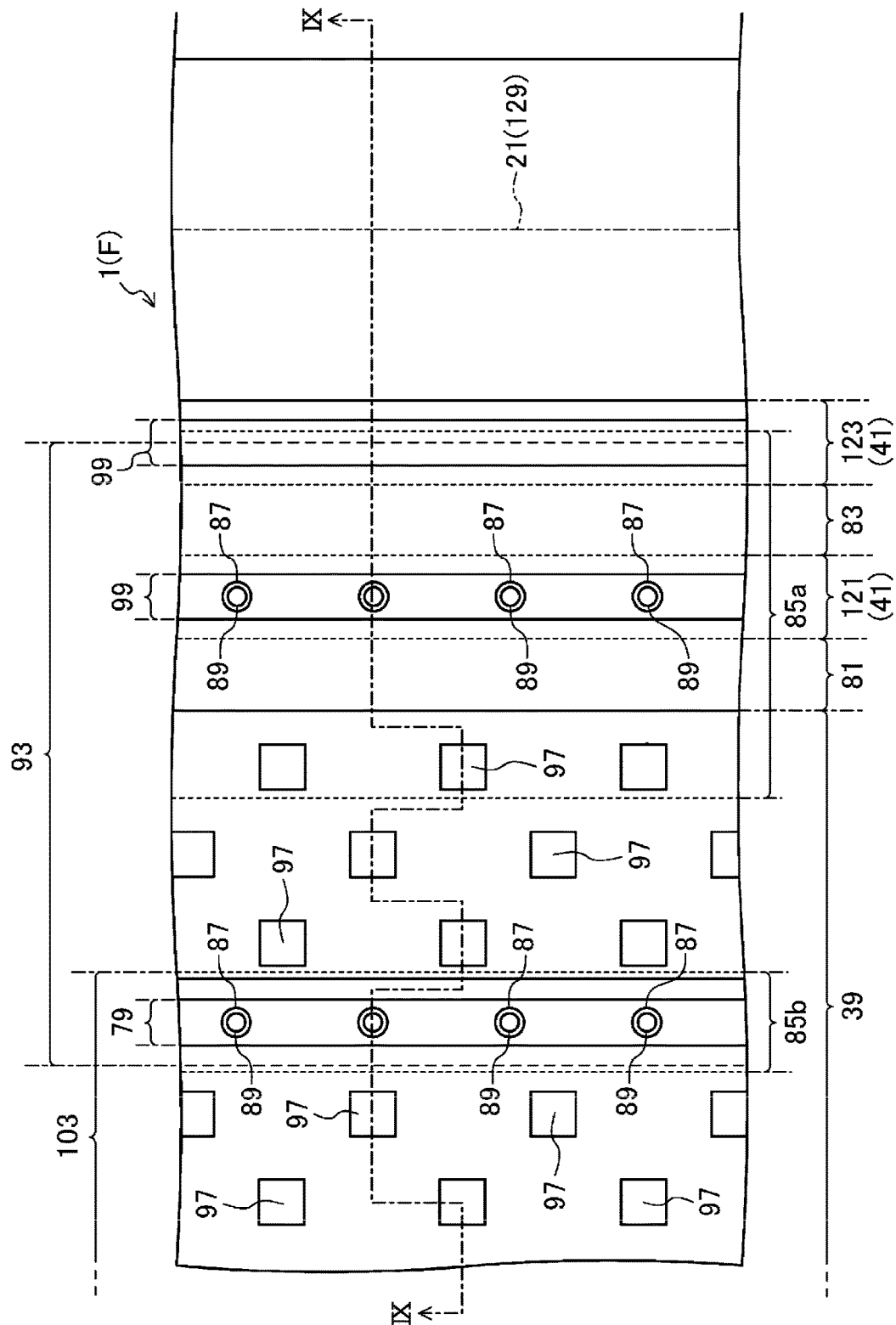
FIG. 8 is a plan view of an organic EL display device in a position corresponding to FIG. 5 according to a first modification example of the first embodiment.
Figure 9:
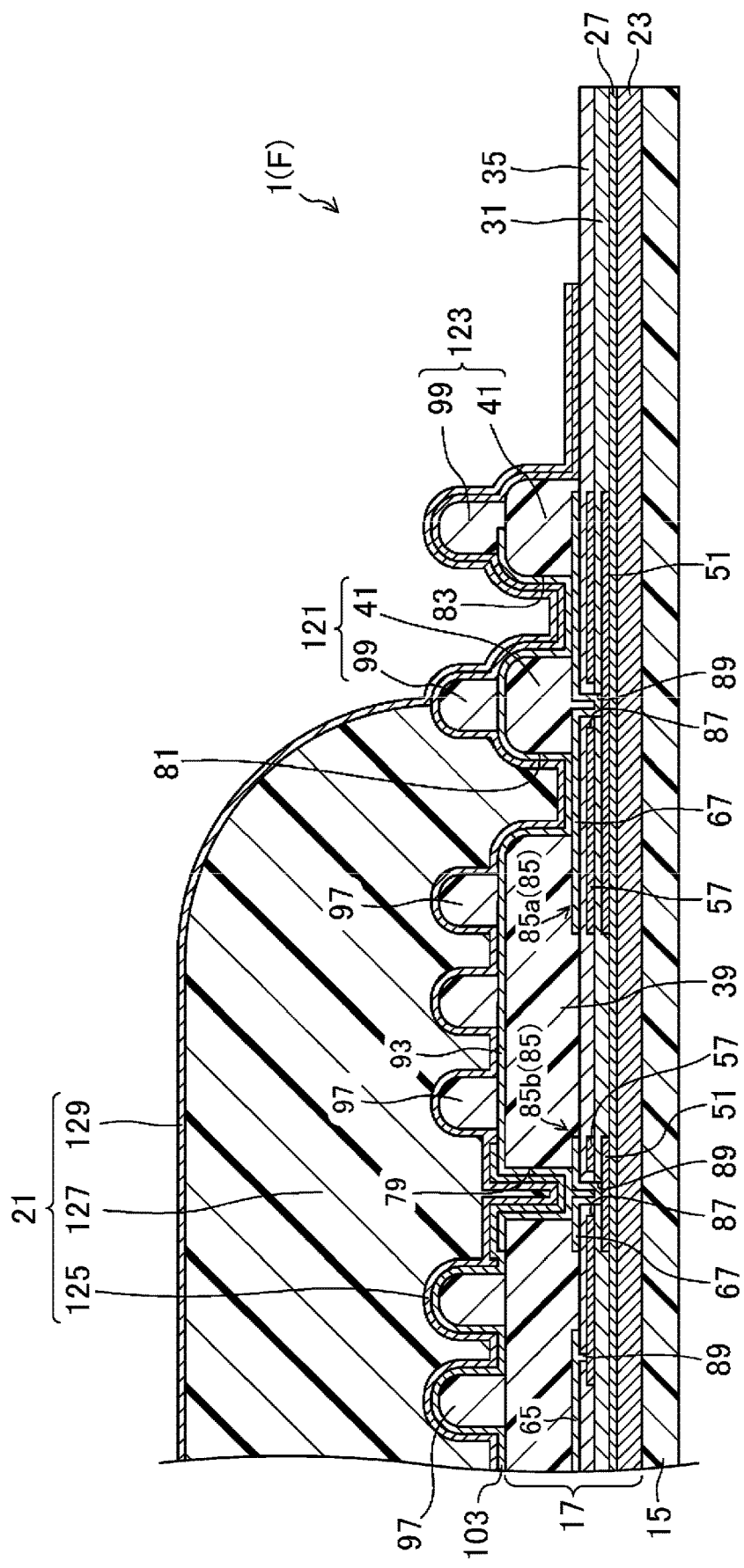
FIG. 9 is a cross-sectional view of the organic EL display device taken along the line VIX-VIX in FIG. 8.

FIG. 8 is a plan view of an organic EL display device 1 in a position corresponding to FIG. 5 according to a first modification example. FIG. 9 is a cross-sectional view of the organic EL display device 1 taken along the line VIX-VIX in FIG. 8.

In the organic EL display device 1 according to the first modification example, as illustrated in FIG. 8 and FIG. 9, in order to connect the second frame capacitance electrode 67 and the third frame capacitance electrode 51 that constitute the first frame capacitor 85a, the first opening 87 formed in the first frame capacitance electrode 57 and the first contact hole 89 formed in the first interlayer insulating film 31 and the second interlayer insulating film 35 inside the first opening 87 are located at a position corresponding to the first dam wall 121, and a plurality of the first openings 87 and a plurality of the first contact holes 89 are formed at intervals from each other along the side of the display region D.

Second Modification Example of First Embodiment

Figure 10:
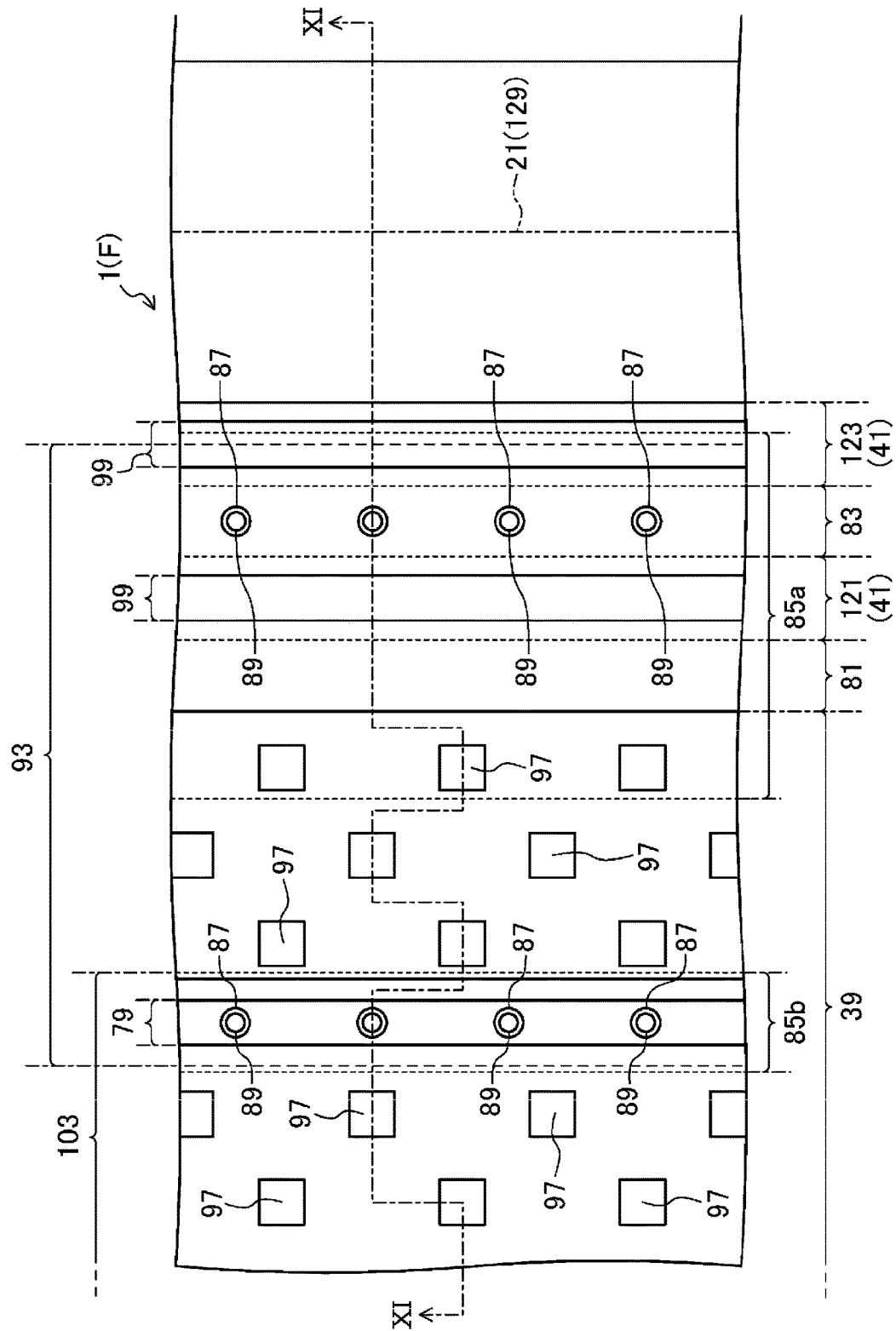
FIG. 10 is a plan view of an organic EL display device in a position corresponding to FIG. 5 according to a second modification example of the first embodiment.
Figure 11:
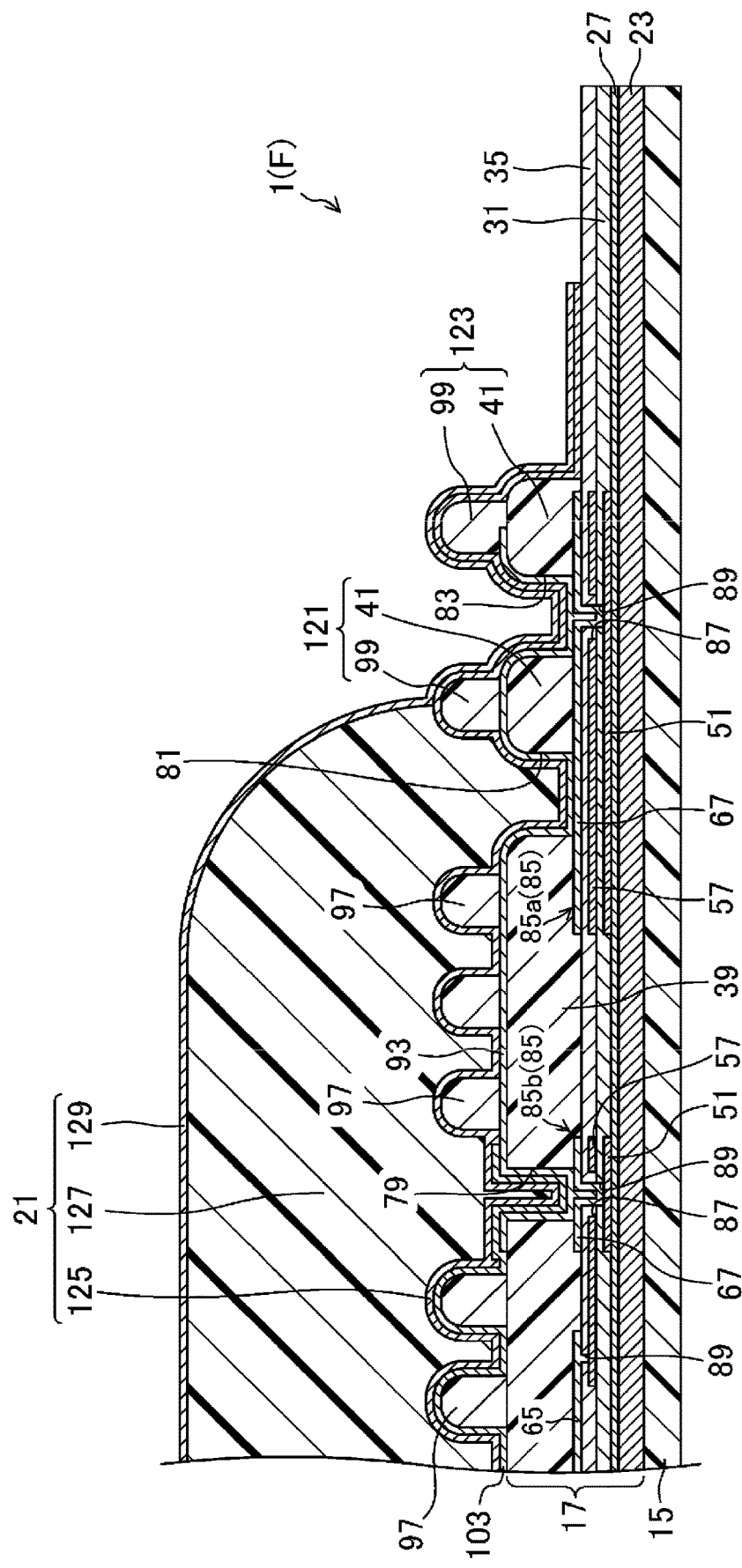
FIG. 11 is a cross-sectional view of the organic EL display device taken along the line XI-XI in FIG. 10.

FIG. 10 is a plan view of an organic EL display device 1 in a position corresponding to FIG. 5 according to a second modification example. FIG. 11 is a cross-sectional view of the organic EL display device 1 taken along the line XI-XI in FIG. 10.

In the organic EL display device 1 according to the second modification example, as illustrated in FIG. 10 and FIG. 11, in order to connect the second frame capacitance electrode 67 and the third frame capacitance electrode 51 that constitute the first frame capacitor 85a, the first opening 87 formed in the first frame capacitance electrode 57 and the first contact hole 89 formed in the first interlayer insulating film 31 and the second interlayer insulating film 35 inside the first opening 87 are located at a position corresponding to the second slit 83, and a plurality of the first openings 87 and a plurality of the first contact holes 89 are formed at intervals from each other along the side of the display region D.

Third Modification Example of First Embodiment

Figure 12:
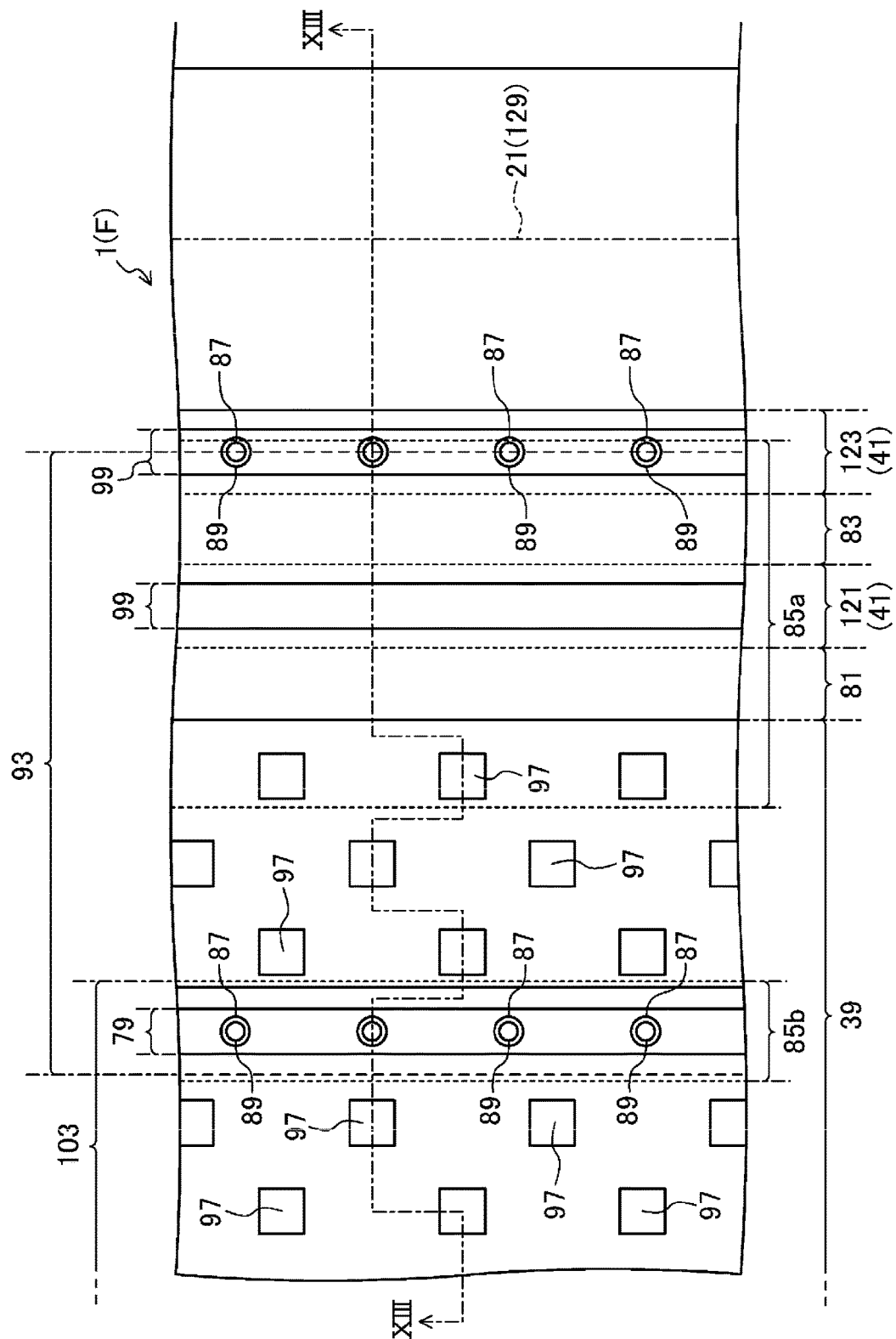
FIG. 12 is a plan view of an organic EL display device in a position corresponding to FIG. 5 according to a third modification example of the first embodiment.
Figure 13:
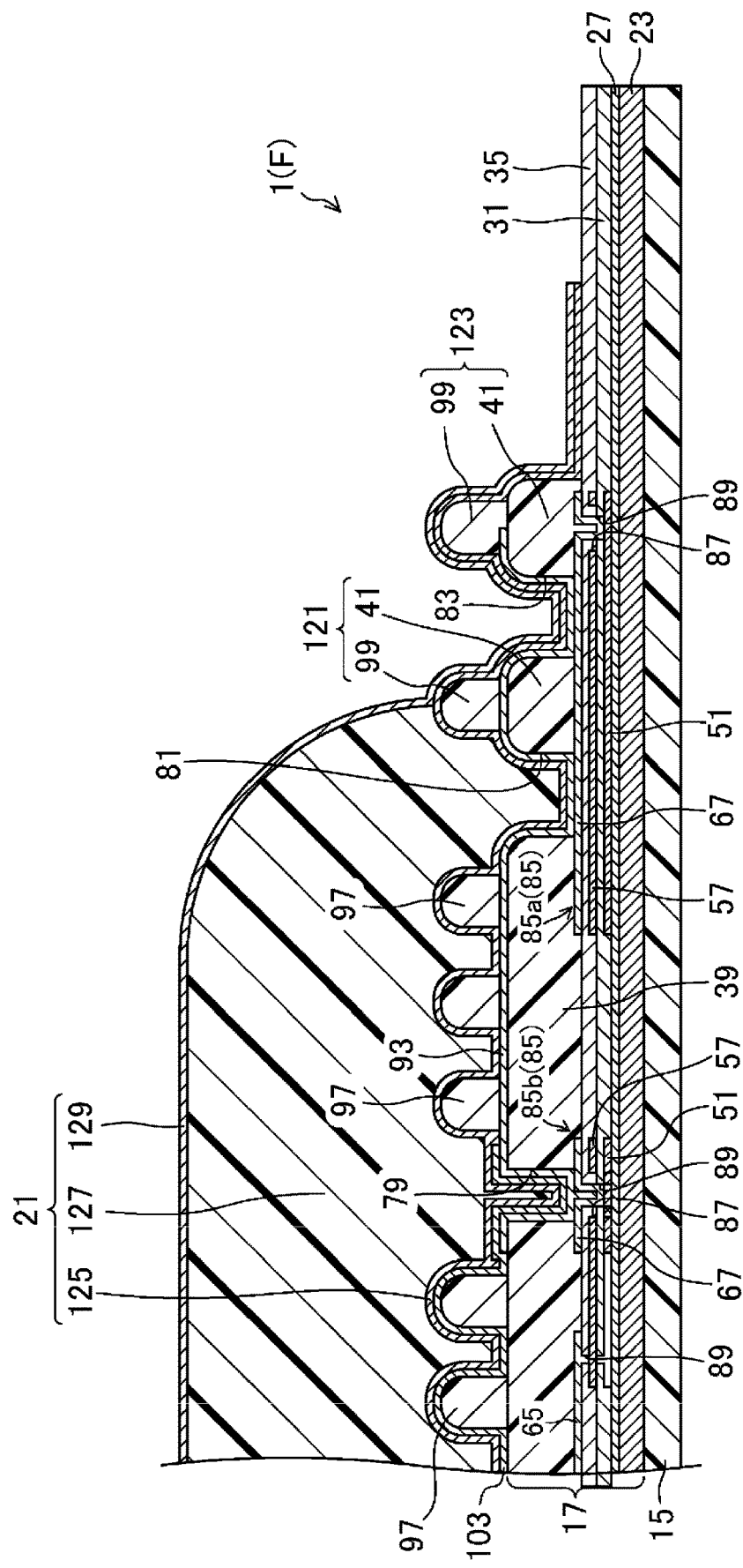
FIG. 13 is a cross-sectional view of the organic EL display device taken along the line XIII-XIII in FIG. 12.

FIG. 12 is a plan view of an organic EL display device 1 in a position corresponding to FIG. 5 according to a third modification example. FIG. 13 is a cross-sectional view of the organic EL display device 1 taken along the line XIII-XIII in FIG. 12.

In the organic EL display device 1 according to the third modification example, as illustrated in FIG. 12 and FIG. 13, in order to connect the second frame capacitance electrode 67 and the third frame capacitance electrode 51 that constitute the first frame capacitor 85a, the first opening 87 formed in the first frame capacitance electrode 57 and the first contact hole 89 formed in the first interlayer insulating film 31 and the second interlayer insulating film 35 inside the first opening 87 are located at a position corresponding to the second dam wall 123, and a plurality of the first openings 87 and a plurality of the first contact holes 89 are formed at intervals from each other along the side of the display region D.

Fourth Modification Example of First Embodiment

Figure 14:
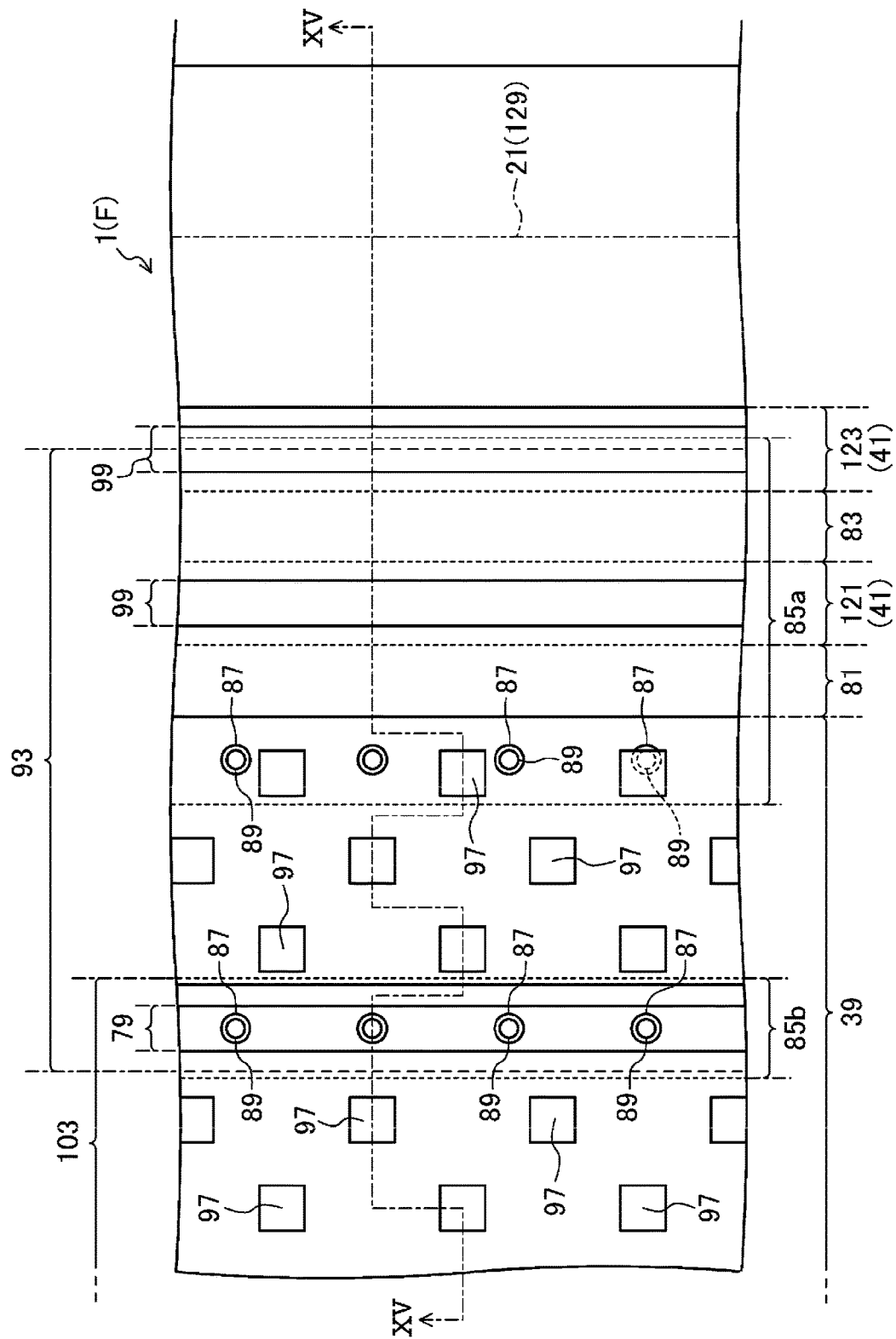
FIG. 14 is a plan view of an organic EL display device in a position corresponding to FIG. 5 according to a fourth modification example of the first embodiment.
Figure 15:
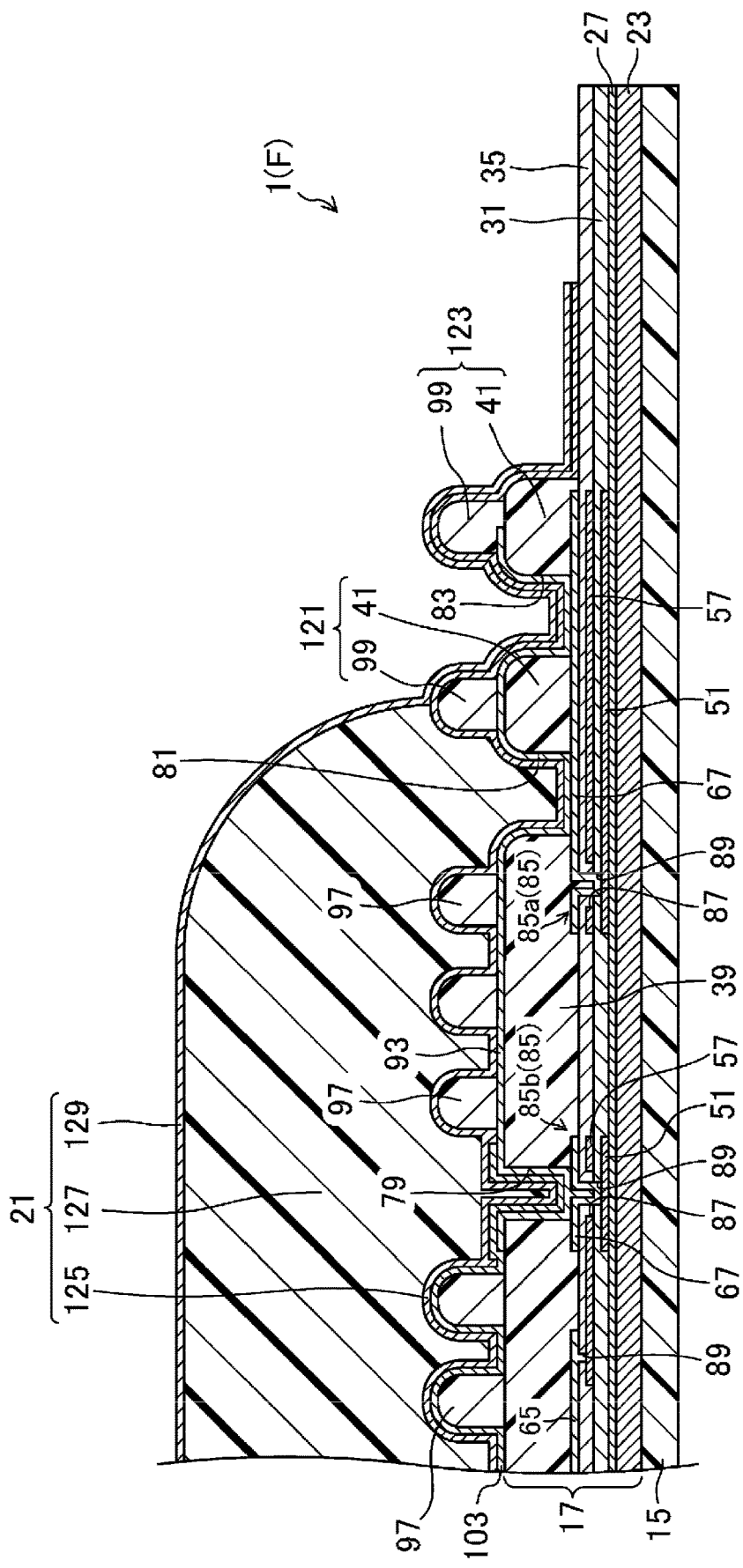
FIG. 15 is a cross-sectional view of the organic EL display device taken along the line XV-XV in FIG. 14.

FIG. 14 is a plan view of an organic EL display device 1 in a position corresponding to FIG. 5 according to a fourth modification example. FIG. 15 is a cross-sectional view of the organic EL display device 1 taken along the line XV-XV in FIG. 14.

In the organic EL display device 1 according to the fourth modification example, as illustrated in FIG. 14 and FIG. 15, in order to connect the second frame capacitance electrode 67 and the third frame capacitance electrode 51 that constitute the first frame capacitor 85a, the first opening 87 formed in the first frame capacitance electrode 57 and the first contact hole 89 formed in the first interlayer insulating film 31 and the second interlayer insulating film 35 inside the first opening 87 are located at a position corresponding to the outer peripheral portion of the flattening film 39, and a plurality of the first openings 87 and a plurality of the first contact holes 89 are formed along the side of the display region D.

Fifth Modification Example of First Embodiment

Figure 16:
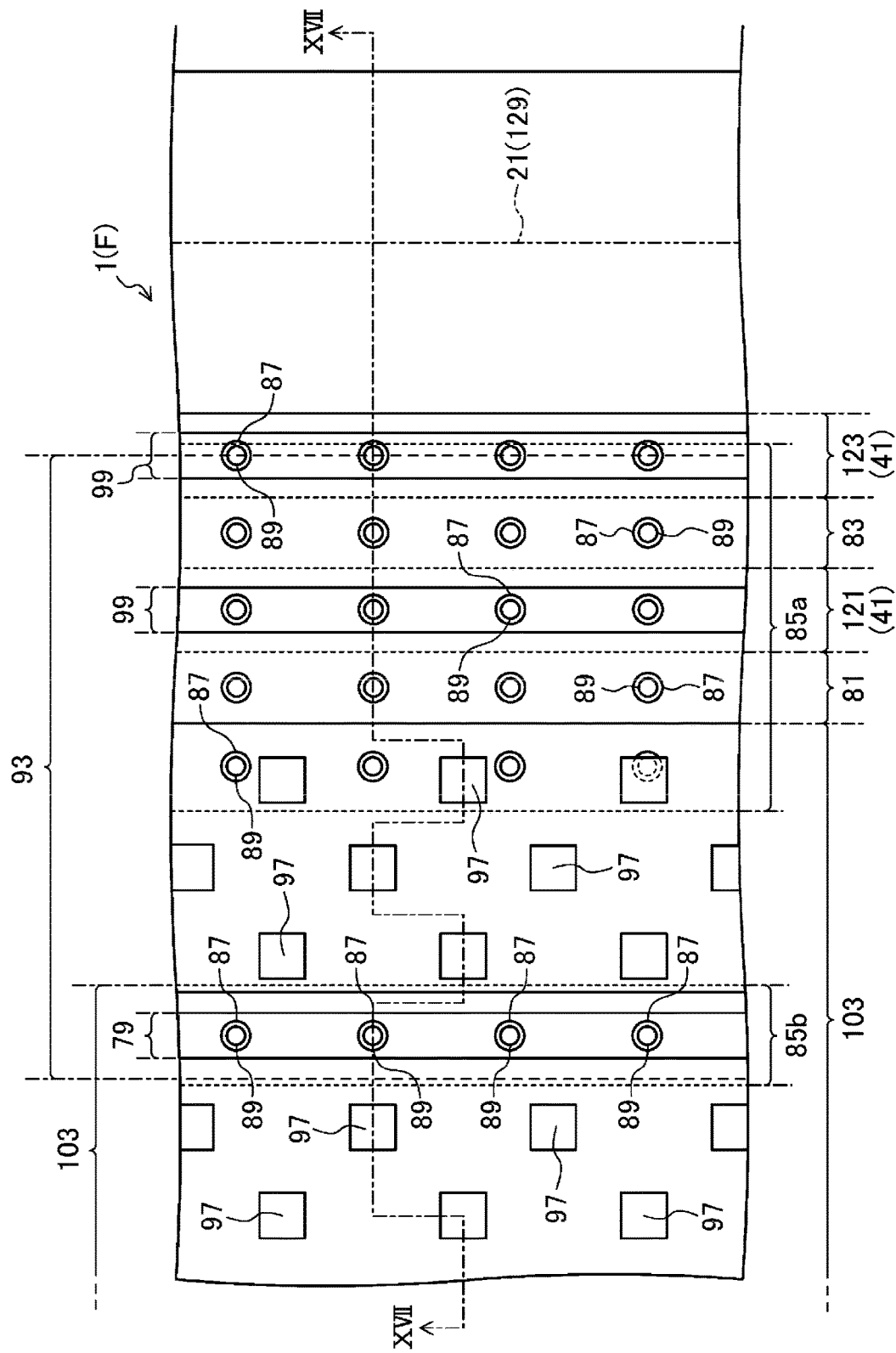
FIG. 16 is a plan view of an organic EL display device in a position corresponding to FIG. 5 according to a fifth modification example of the first embodiment.
Figure 17:
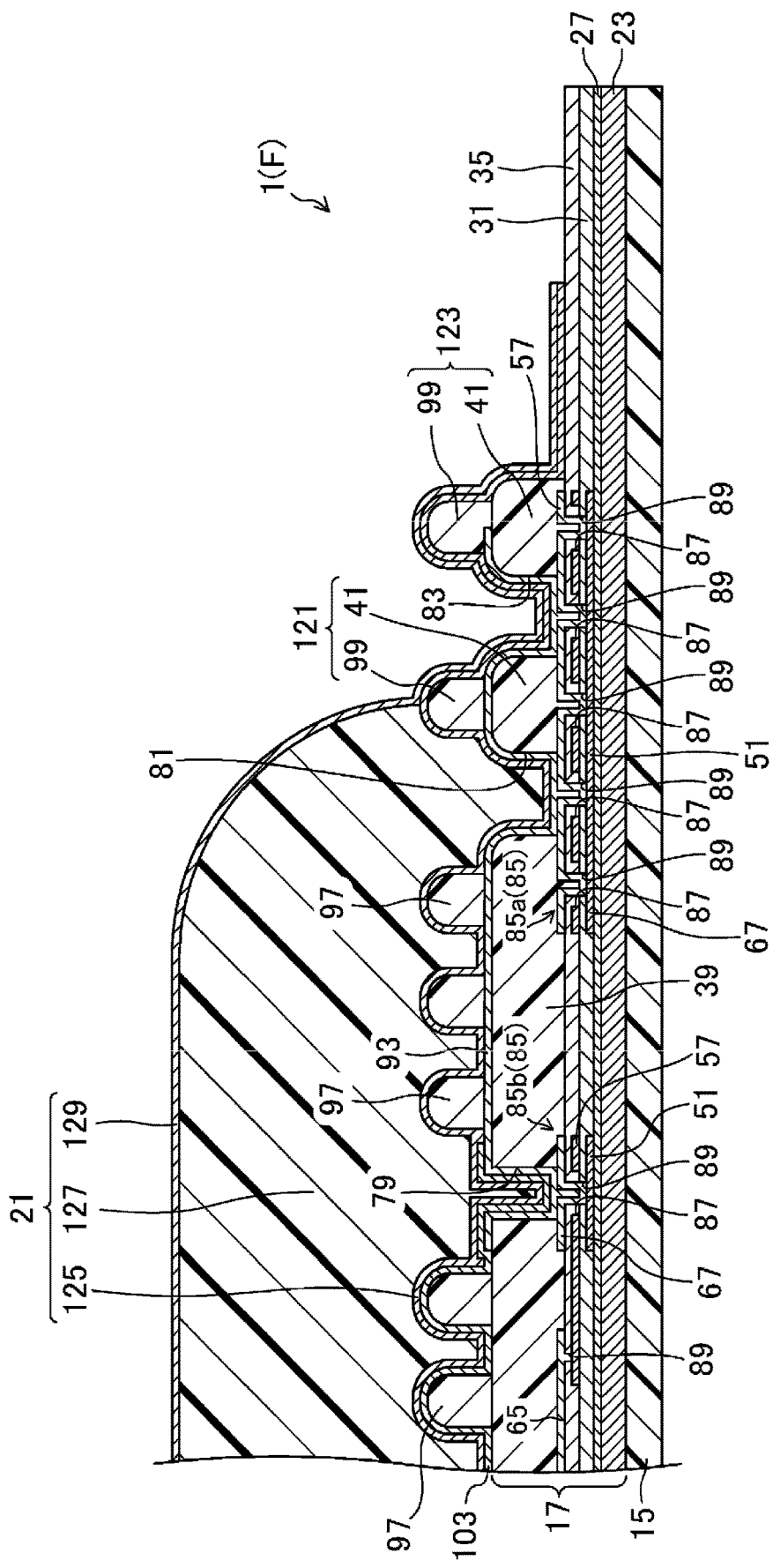
FIG. 17 is a cross-sectional view of the organic EL display device taken along the line XVII-XVII in FIG. 16.

FIG. 16 is a plan view of an organic EL display device 1 in a position corresponding to FIG. 5 according to a fifth modification example. FIG. 17 is a cross-sectional view of the organic EL display device 1 taken along the line XVII-XVII in FIG. 16.

In the organic EL display device 1 according to the fifth modification example, as illustrated in FIG. 16 and FIG. 17, in order to connect the second frame capacitance electrode 67 and the third frame capacitance electrode 51 that constitute the first frame capacitor 85a, the first opening 87 formed in the first frame capacitance electrode 57 and the first contact hole 89 formed in the first interlayer insulating film 31 and the second interlayer insulating film 35 inside the first opening 87 are located at each of a position corresponding to the first slit 81, a position corresponding to the first dam wall 121, a position corresponding to the second slit 83, a position corresponding to the second dam wall 123, and a position corresponding to the outer peripheral portion of the flattening film 39, and a plurality of the first openings 87 and a plurality of the first contact holes 89 are formed at intervals from each other along the side of the display region D at each position of these.

The forming position of the first contact hole 89 for connecting the second frame capacitance electrode 67 and the third frame capacitance electrode 51 in the organic EL display device 1 according to each of the first embodiment and the first to fifth modification examples of the first embodiment described above is merely exemplary, and at least one contact hole 89 may be provided and can be formed at any position.

In the organic EL display device 1 according to each of the first embodiment and the first to fifth modification examples of the first embodiment, an aspect has been illustrated in which the frame capacitor 85 is provided separately as the first frame capacitor 85a provided at the outer peripheral position of the flattening film 39 (a position corresponding to the first slit 81 and the second slit 83) and the second frame capacitor 85b provided at a position corresponding to the trench 79. However, the frame capacitor 85 may be provided in a continuation from a position corresponding to the trench 79 to the outer peripheral position of the flattening film 39 in a manner that integrates the first frame capacitor 85a and the second frame capacitor 85b.

Second Embodiment

Figure 18:
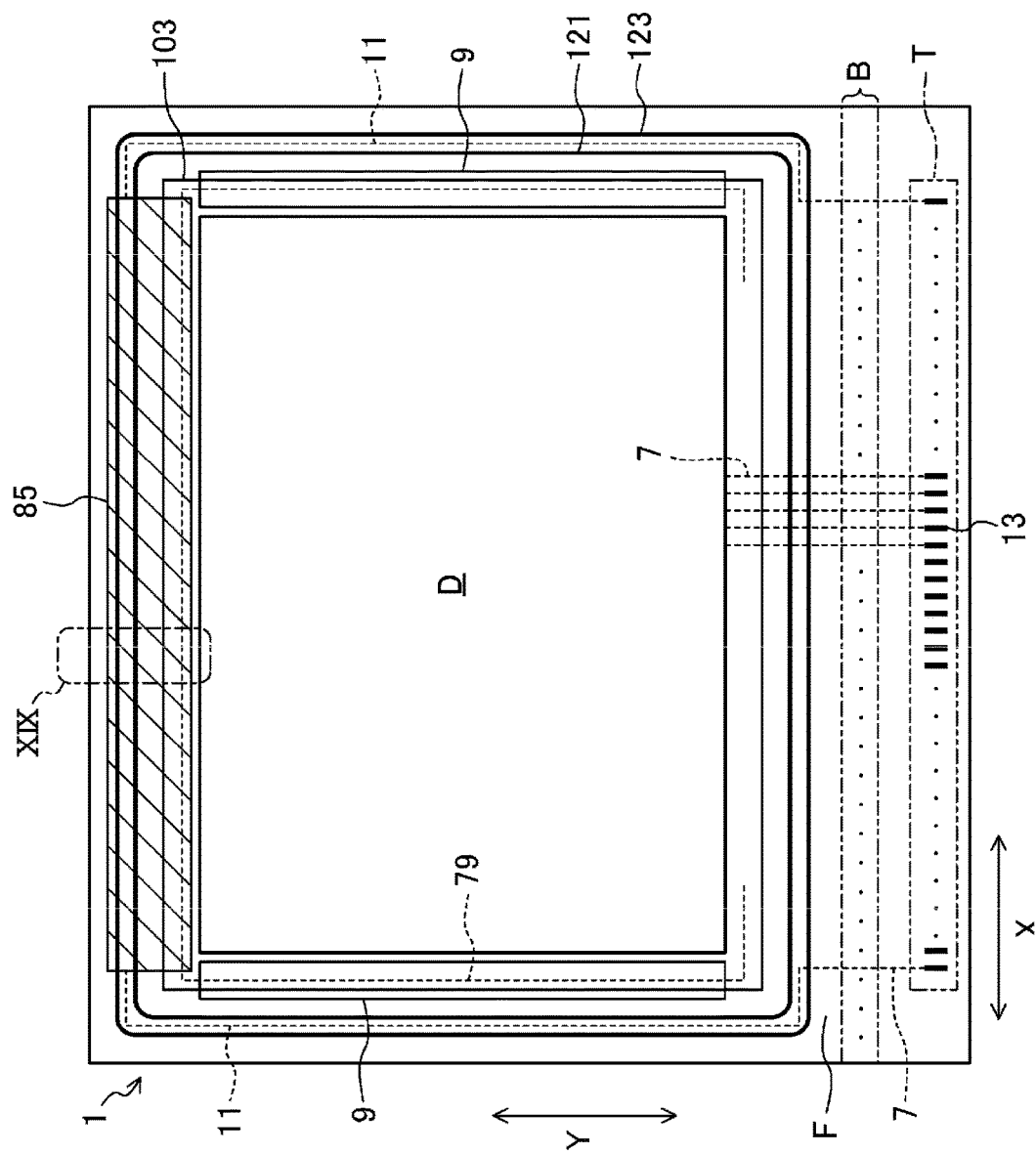
FIG. 18 is a plan view illustrating a schematic configuration of an organic EL display device according to a second embodiment.
Figure 19:
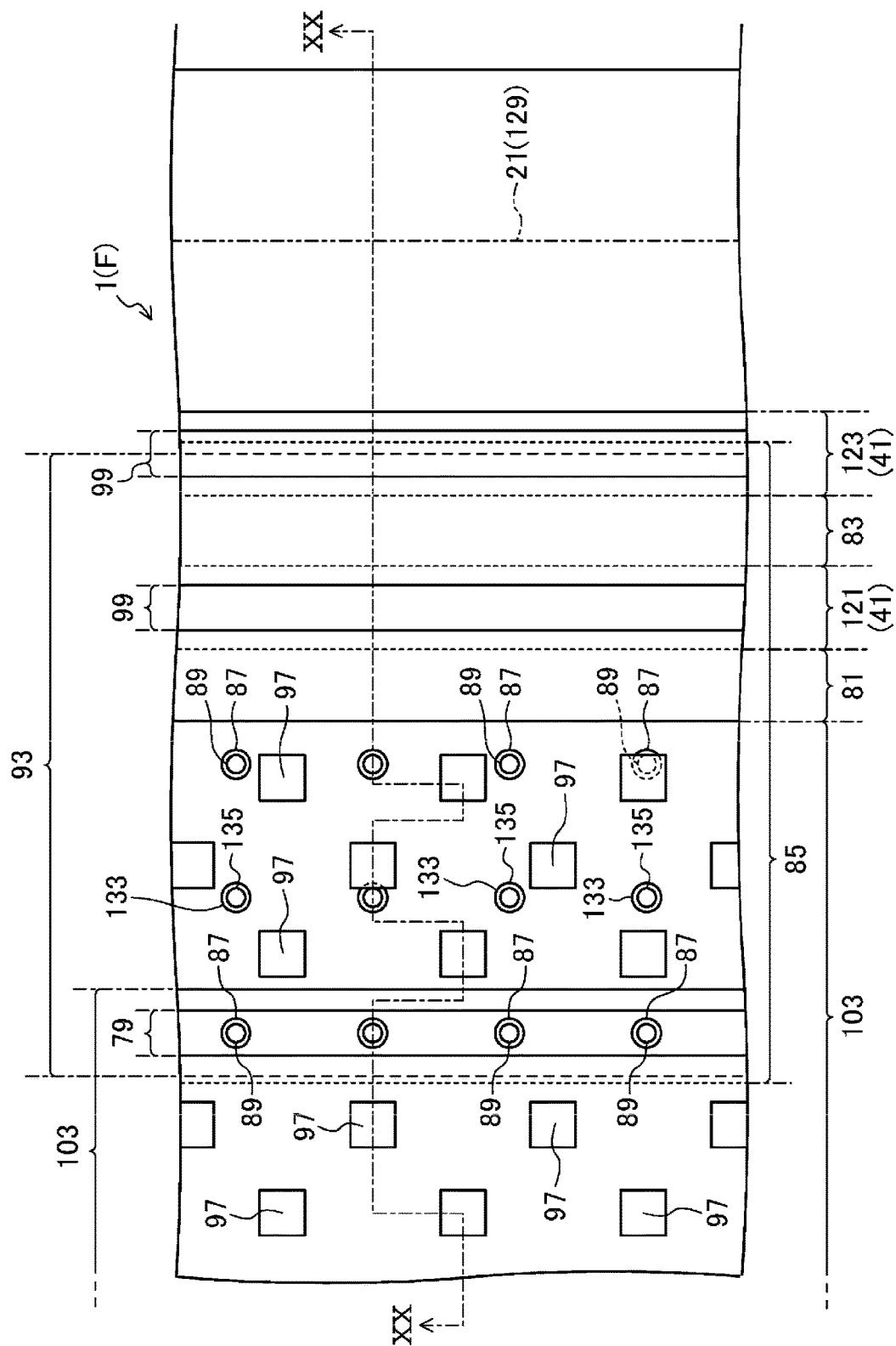
FIG. 19 is a plan view illustrating a configuration of a frame region of the organic EL display device, the frame region being surrounded by XIX in FIG. 18.
Figure 20:
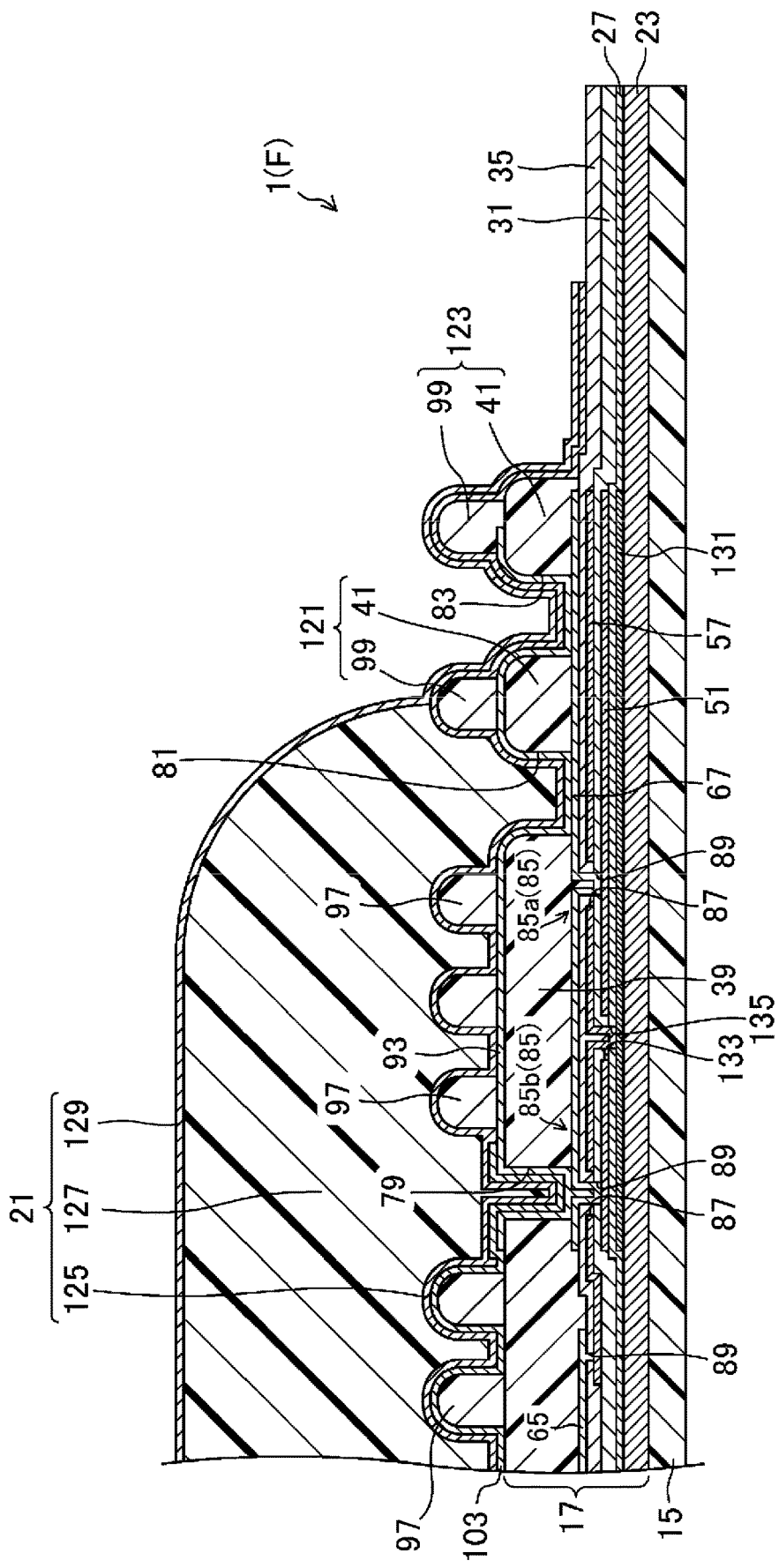
FIG. 20 is a cross-sectional view of the organic EL display device taken along the line XX-XX in FIG. 19.

The organic EL display device 1 according to a second embodiment differs from the organic EL display device 1 according to the first embodiment in the configuration of the frame capacitor 85. Note that the second embodiment is configured in the similar manner to that of the first embodiment described above with respect to the organic EL display device 1, except that the configuration of the frame capacitor 85 is different from that of the first embodiment described above. FIG. 18 is a plan view illustrating a schematic configuration of an organic EL display device 1 according to the second embodiment. FIG. 19 is a plan view illustrating a configuration of a frame region F of the organic EL display device 1, the frame region being surrounded by XIX in FIG. 18. FIG. 20 is a cross-sectional view of the organic EL display device 1 taken along the line XX-XX in FIG. 19.

As illustrated in FIG. 18, in the organic EL display device 1 according to the second embodiment, one frame capacitor 85 is provided in a portion of the frame region F that constitutes a side located on the opposite side to the terminal portion T with the display region D interposed therebetween, along a side of two sides facing the terminal portion T in the display region D, the side being the one farther from the terminal portion T. The frame capacitor 85 is provided in a continuation from the inner region to the outer region of the flattening film 39 (hatched portion in FIG. 18).

The frame capacitor 85, in addition to the first frame capacitance electrode 57, the second interlayer insulating film 35, the second frame capacitance electrode 67, the first interlayer insulating film 31, and the third frame capacitance electrode 51, includes a fourth frame capacitance electrode 131 and a gate insulating film 27. As illustrated in FIG. 20, each of the first frame capacitance electrode 57, the second frame capacitance electrode 67, the third frame capacitance electrode 51, and the fourth frame capacitance electrode 131 is provided in the region spanning from the position closer to the display region D than the trench 79 to the position overlapping with the second dam wall 123.

The first frame capacitance electrode 57 is connected to the high-level power source wiring line 65 via the contact hole 89 formed in the second interlayer insulating film 35. In the first frame capacitance electrode 57, the first opening 87 that extends through the first frame capacitance electrode 57 is formed at each of a position corresponding to the trench 79 and a position overlapping with the outer peripheral portion of the flattening film 39.

The second frame capacitance electrode 67 is connected to and in contact with the intermediate conductive film 93 inside the trench 79, inside the first slit 81, and inside the second slit 83. The second frame capacitance electrode 67 is connected to the third frame capacitance electrode 51 via the first contact hole 89 formed in the first interlayer insulating film 31 and the second interlayer insulating film 35 inside each first opening 87. A second opening 133 that extends through the third frame capacitance electrode 51 is formed at a position overlapping with the flattening film 39 in the third frame capacitance electrode 51.

The fourth frame capacitance electrode 131 is formed by the same material in the same layer as the semiconductor layer 25, and is constituted by the semiconductor layer 25 being made conductive. The fourth frame capacitance electrode 131 is provided so as to face the third frame capacitance electrode 51 with the gate insulating film 27 interposed therebetween. The first frame capacitance electrode 57 is connected to the fourth frame capacitance electrode 131 via the second contact hole 135 formed in the gate insulating film 27 inside the second opening 133. The fourth frame capacitance electrode 131 is connected to the high-level power source wiring line 65 via the first frame capacitance electrode 57.

As illustrated in FIG. 19 and FIG. 20, in order to connect the second frame capacitance electrode 67 and the third frame capacitance electrode 51, the first opening 87 formed in the first frame capacitance electrode 57 and the first contact hole 89 formed in the first interlayer insulating film 31 and the second interlayer insulating film 35 inside the first opening 87 are located at each of a position corresponding to the trench and a position corresponding to the outer peripheral portion of the flattening film 39, and, similar to the fourth modification of the first embodiment, a plurality of the first openings 87 and a plurality of the first contact holes 89 are formed at intervals from each other along the side of the display region D. In order to connect the first frame capacitance electrode 57 and the fourth frame capacitance electrode 131, the second opening 133 formed in the third frame capacitance electrode 51 and the second contact hole 135 formed in the gate insulating film 27 inside the second opening 133 are located at a position corresponding to the flattening film 39 between the trench 79 and the first slit 81, and a plurality of the second openings 133 and a plurality of the second contact holes 135 are formed along the side of the display region D.

According to the organic EL display device 1 according to the second embodiment, the frame capacitor 85 is provided across the trench 79 and the second dam wall 123, so the storage capacity of the frame capacitor 85 is increased. The fourth frame capacitance electrode 131 connected to the high-level power source wiring line 65 is provided so as to face the third frame capacitance electrode 51 connected to the low-level power source wiring line 11, via the gate insulating film 27, and thus the storage capacity of the frame capacitor 85 is increased when the charge is stored between the third frame capacitance electrode 51 and the fourth frame capacitance electrode 131. These are advantageous for compensating for the voltage that drops due to the IR drop in the voltages applied between the first electrode 91 and the second electrode 103 of the organic EL element 105.

First Modification Example of Second Embodiment

Figure 21:
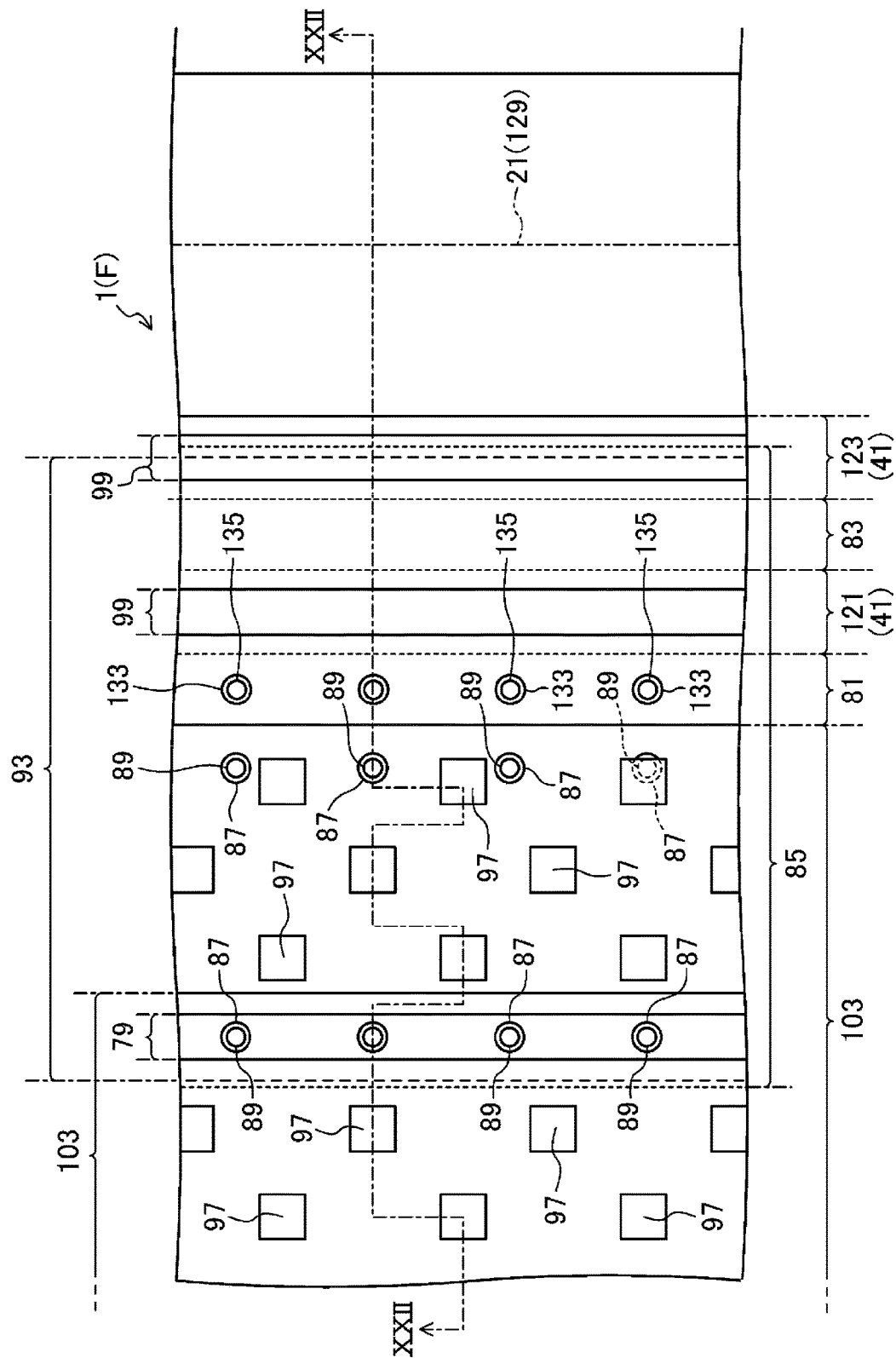
FIG. 21 is a plan view of an organic EL display device in a position corresponding to FIG. 5 according to a first modification example of the second embodiment.
Figure 22:
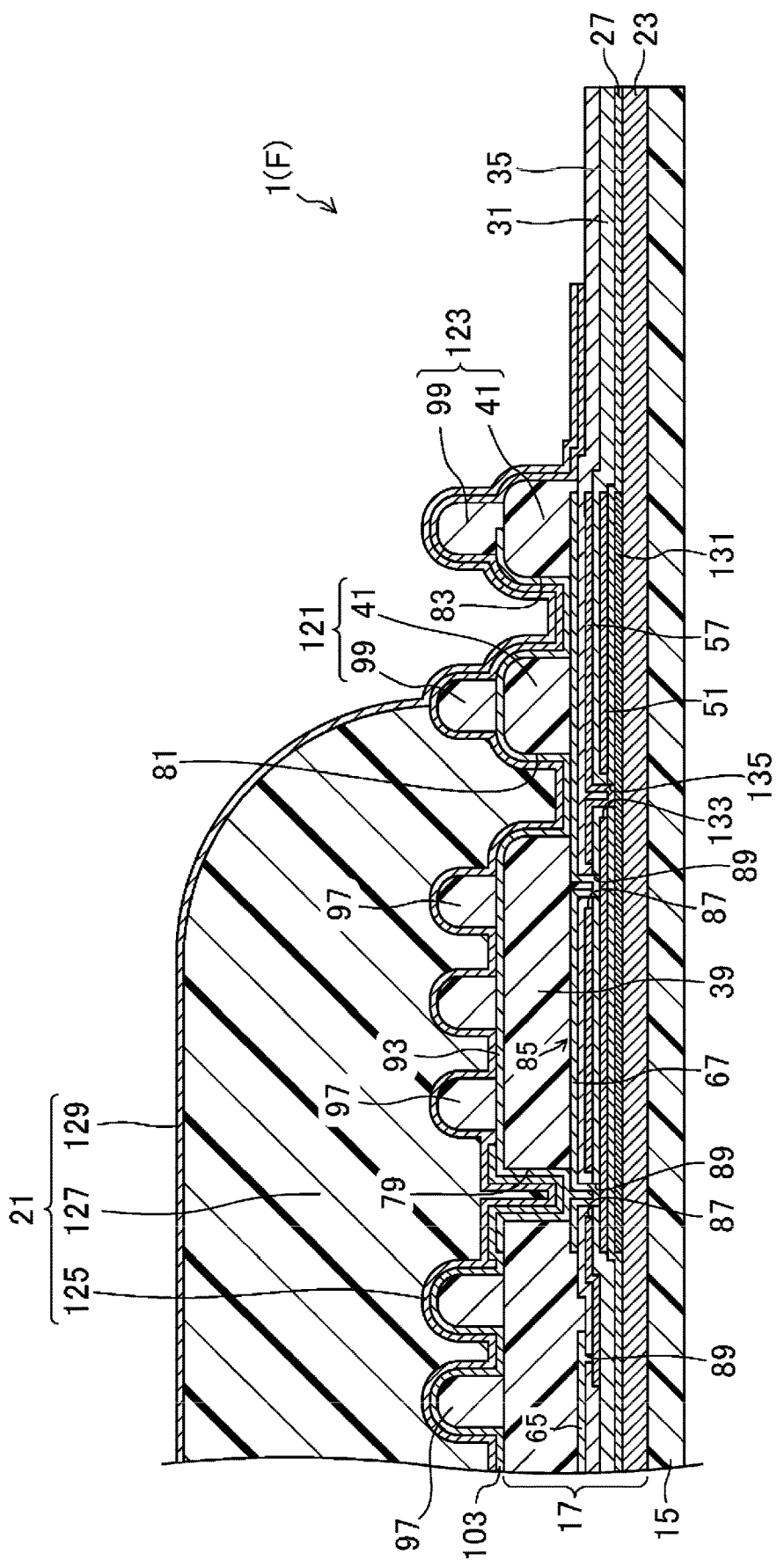
FIG. 22 is a cross-sectional view of the organic EL display device taken along the line XXII-XXII in FIG. 21.

FIG. 21 is a plan view of an organic EL display device 1 in a position corresponding to FIG. 5 according to a first modification example. FIG. 22 is a cross-sectional view of the organic EL display device 1 taken along the line XXII-XXII in FIG. 21.

In the organic EL display device 1 according to the first modification example, as illustrated in FIG. 21 and FIG. 22, in order to connect the first frame capacitance electrode 57 and the fourth frame capacitance electrode 131 that constitute the frame capacitor 85, the second opening 133 formed in the third frame capacitance electrode 51 and the second contact hole 135 formed in the gate insulating film 27 inside the second opening 133 are located at a position corresponding to the first slit 81, and a plurality of the second openings 133 and a plurality of the second contact holes 135 are formed at intervals from each other along the side of the display region D.

Second Modification Example of Second Embodiment

Figure 23:
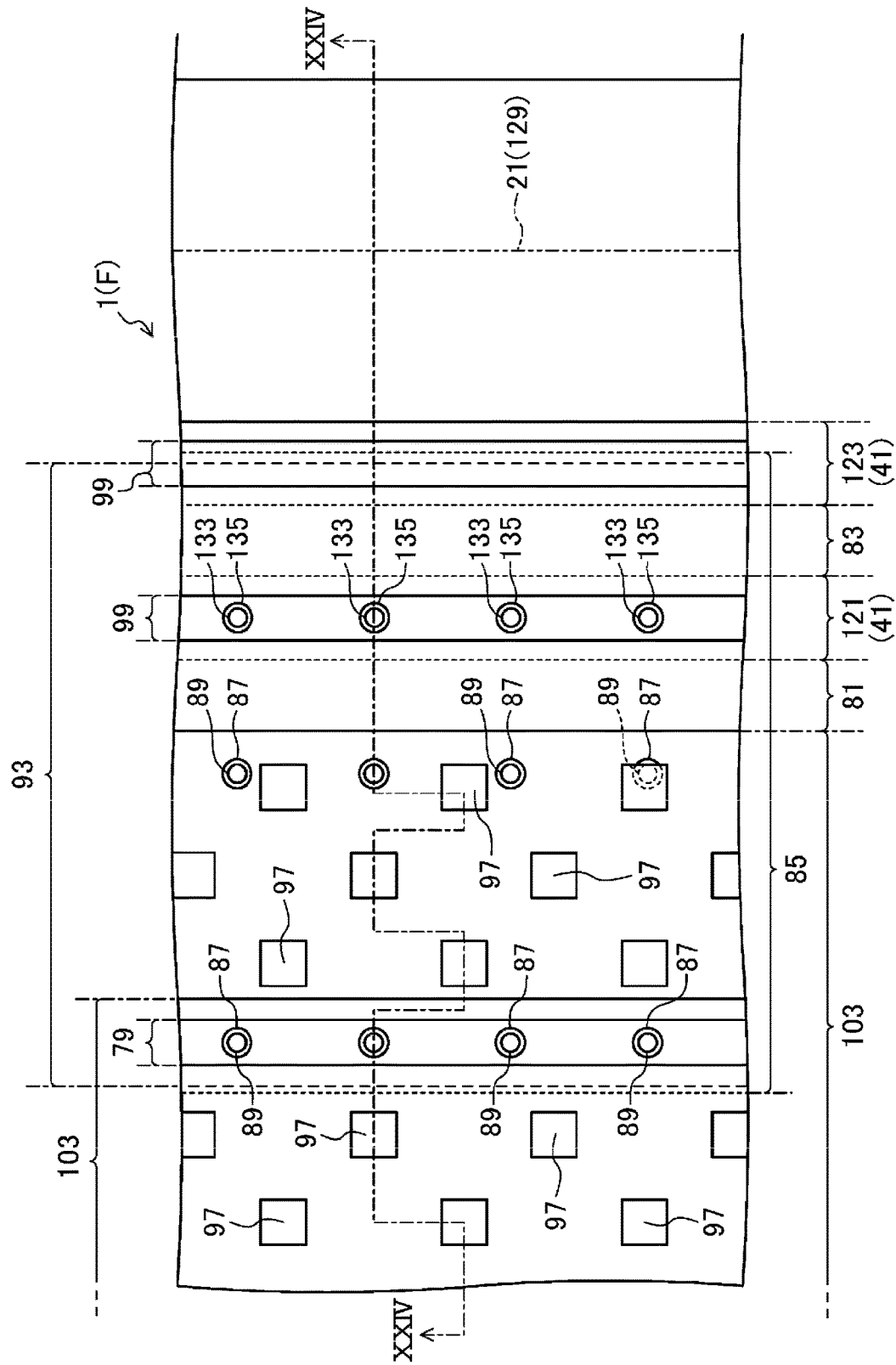
FIG. 23 is a plan view of an organic EL display device in a position corresponding to FIG. 5 according to a second modification example of the second embodiment.
Figure 24:
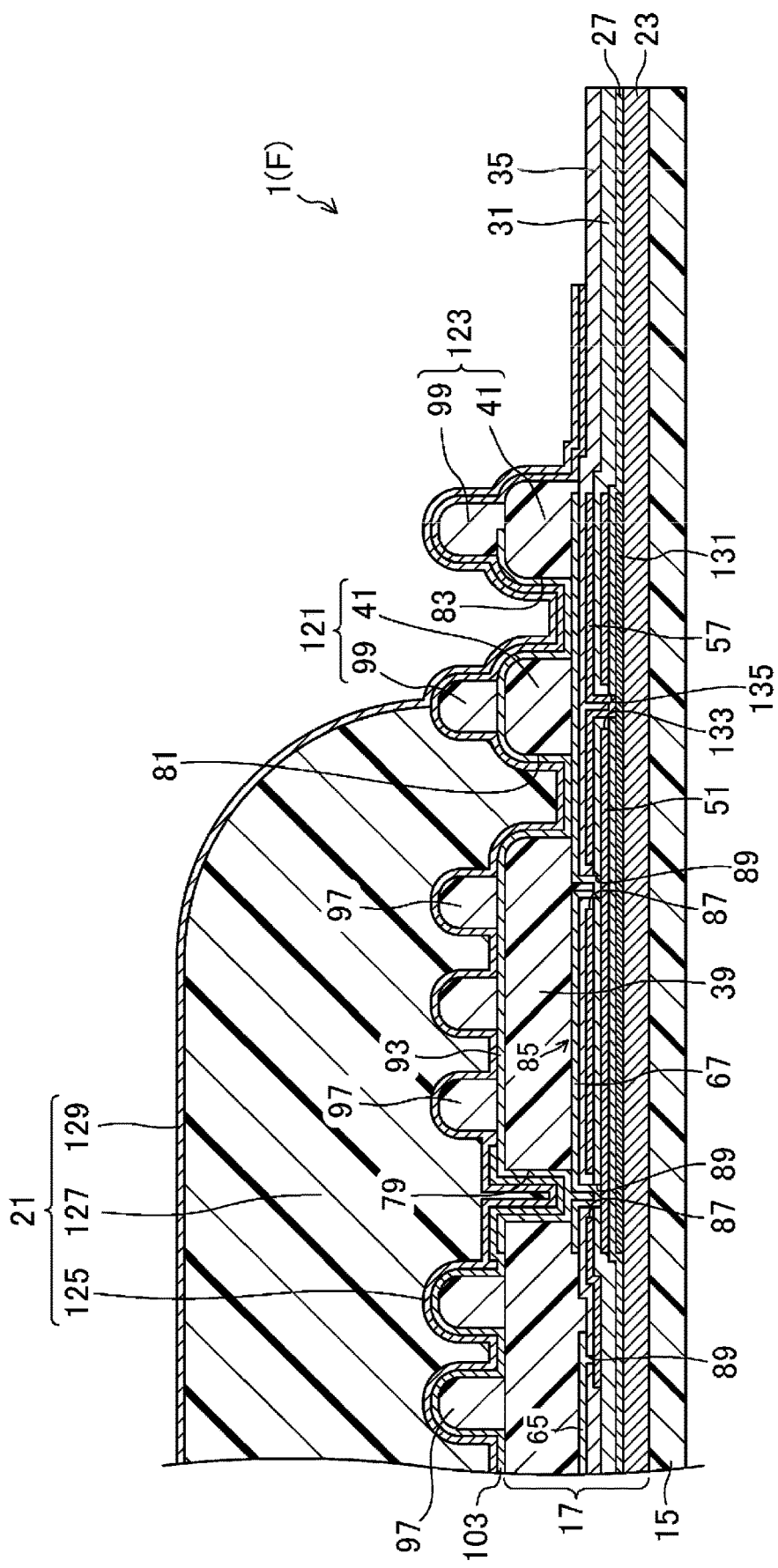
FIG. 24 is a cross-sectional view of the organic EL display device taken along the line XXIV-XXIV in FIG. 23.

FIG. 23 is a plan view of an organic EL display device 1 in a position corresponding to FIG. 5 according to a second modification example. FIG. 24 is a cross-sectional view of the organic EL display device 1 taken along the line XXIV-XXIV in FIG. 23.

In the organic EL display device 1 according to the second modification example, as illustrated in FIG. 23 and FIG. 24, in order to connect the first frame capacitance electrode 57 and the fourth frame capacitance electrode 131 that constitute the frame capacitor 85, the second opening 133 formed in the third frame capacitance electrode 51 and the second contact hole 135 formed in the gate insulating film 27 inside the second opening 133 are located at a position corresponding to the first dam wall 121, and a plurality of the second openings 133 and a plurality of the second contact holes 135 are formed at intervals from each other along the side of the display region D.

Third Modification Example of Second Embodiment

Figure 25:
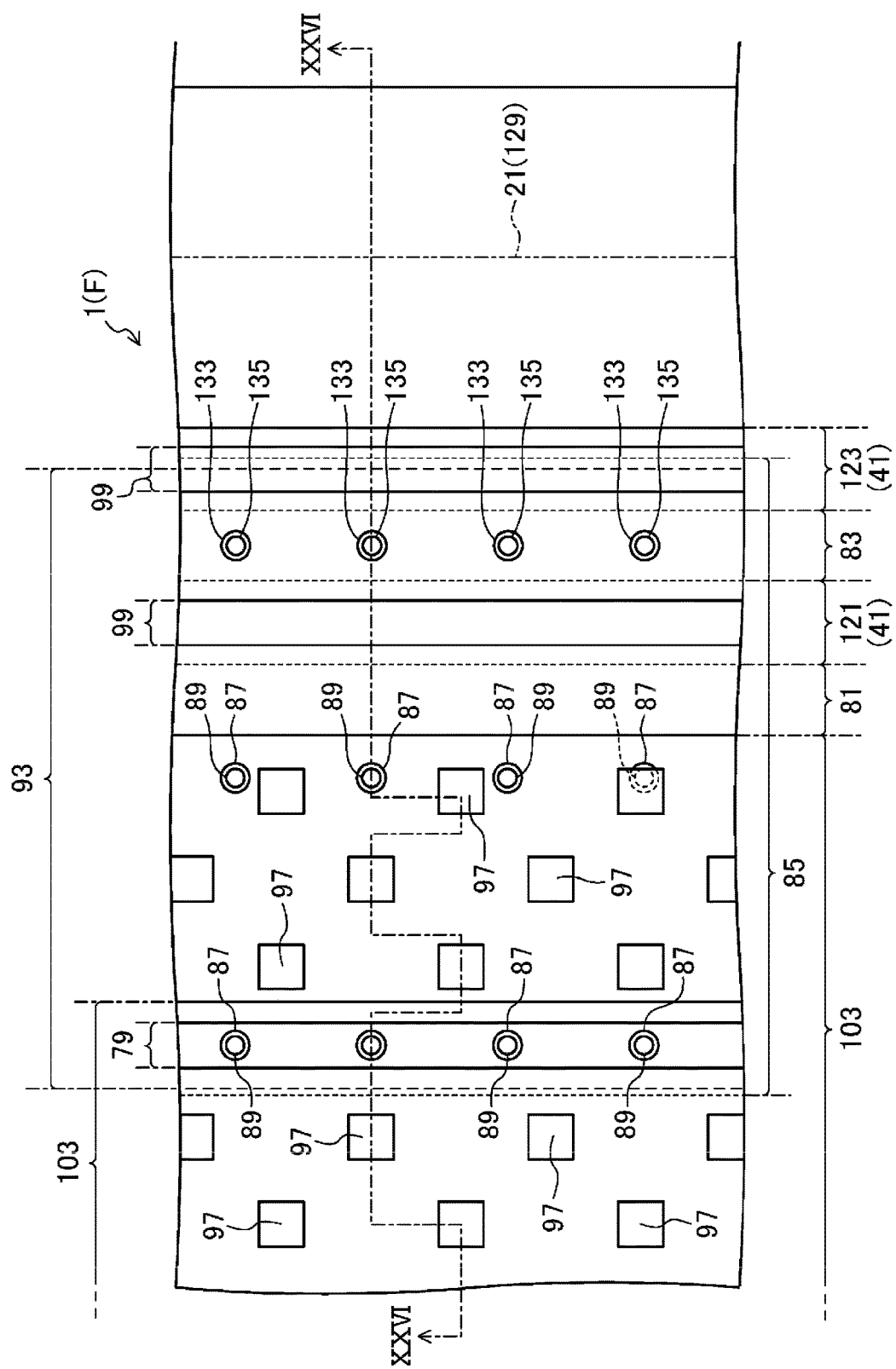
FIG. 25 is a plan view of an organic EL display device in a position corresponding to FIG. 5 according to a third modification example of the second embodiment.
Figure 26:
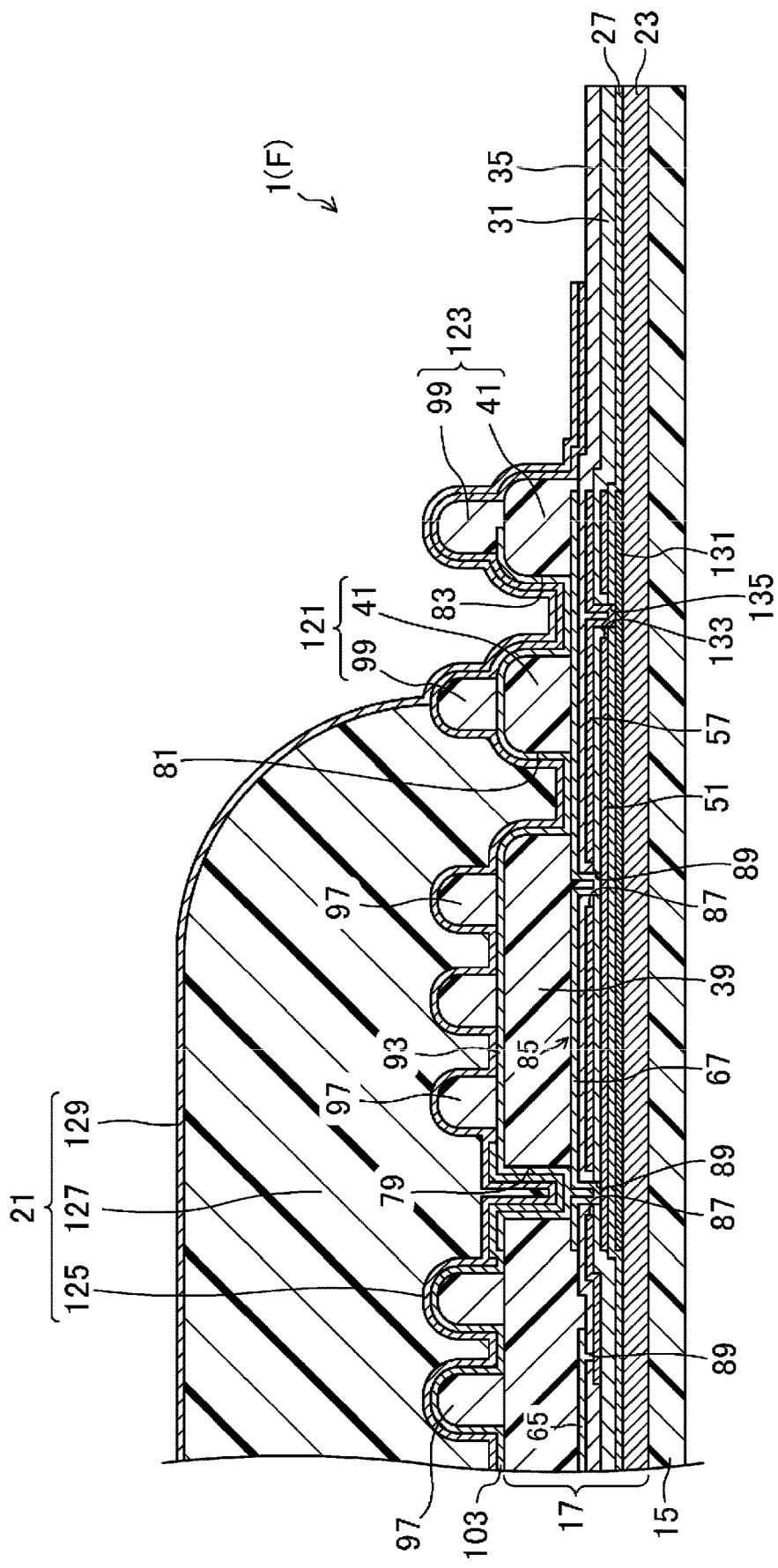
FIG. 26 is a cross-sectional view of the organic EL display device taken along the line XXVI-XXVI in FIG. 25.

FIG. 25 is a plan view of an organic EL display device 1 in a position corresponding to FIG. 5 according to a third modification example. FIG. 26 is a cross-sectional view of the organic EL display device 1 taken along the line XXVI-XXVI in FIG. 25.

In the organic EL display device 1 according to the third modification example, as illustrated in FIG. 25 and FIG. 26, in order to connect the first frame capacitance electrode 57 and the fourth frame capacitance electrode 131 that constitute the frame capacitor 85, the second opening 133 formed in the third frame capacitance electrode 51 and the second contact hole 135 formed in the gate insulating film 27 inside the second opening 133 are located at a position corresponding to the second slit 83, and a plurality of the second openings 133 and a plurality of the second contact holes 135 are formed at intervals from each other along the side of the display region D.

Fourth Modification Example of Second Embodiment

Figure 27:
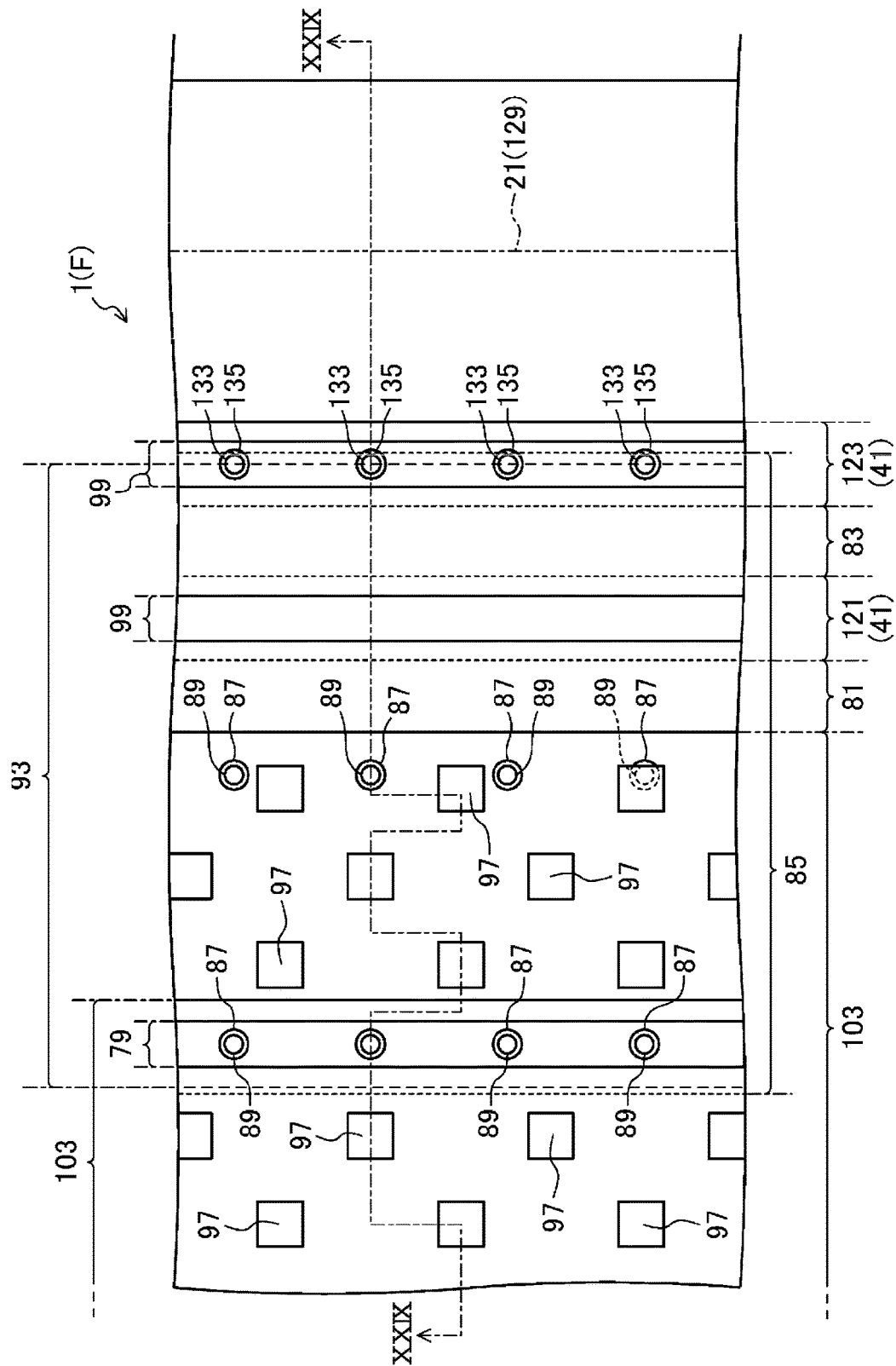
FIG. 27 is a cross-sectional view of an organic EL display device according to a fourth modification example of the second embodiment.
Figure 28:
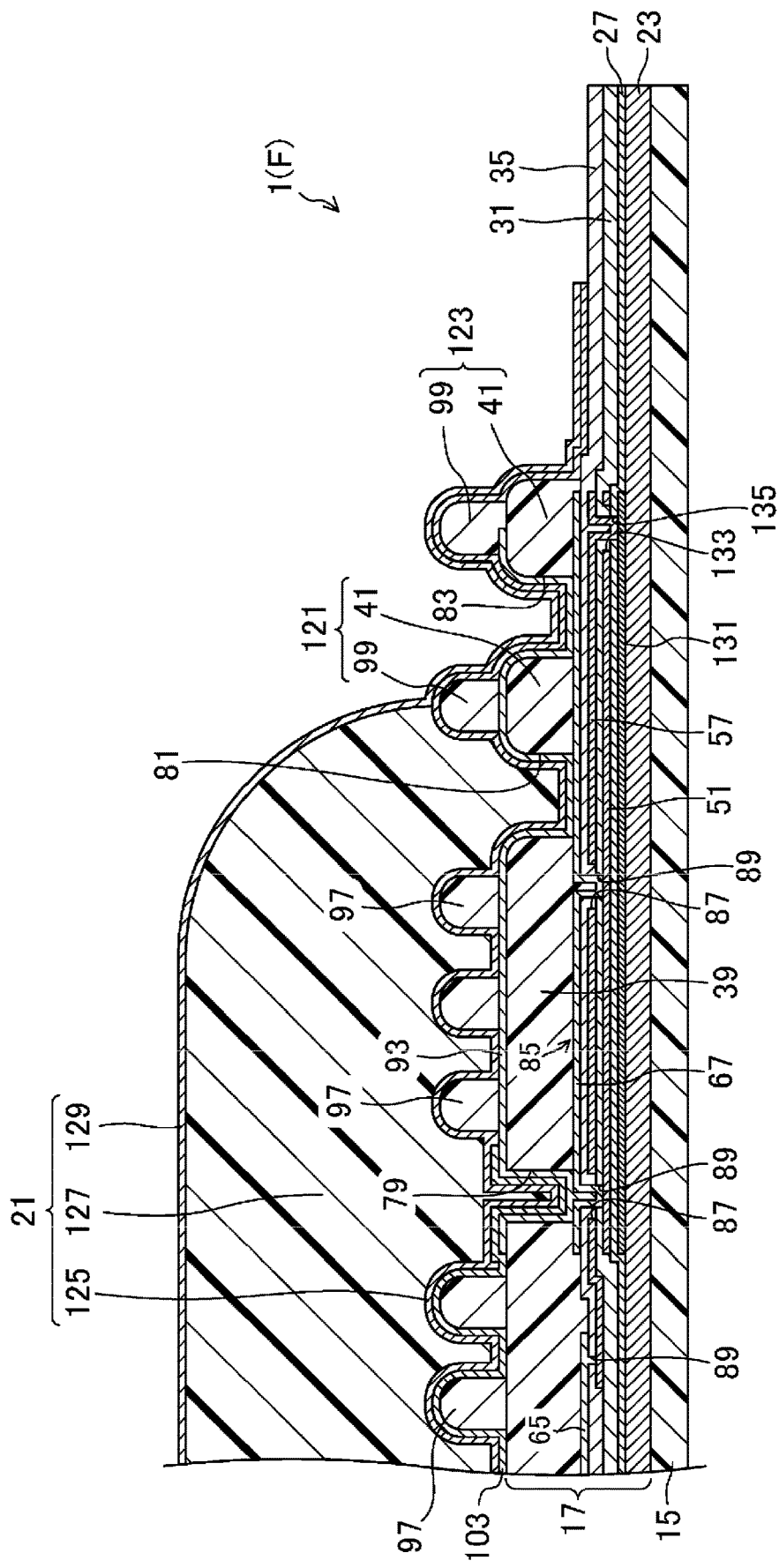
FIG. 28 is a cross-sectional view of the organic EL display device taken along the line XXVIII-XXVIII in FIG. 27.

FIG. 27 is a plan view of an organic EL display device 1 in a position corresponding to FIG. 5 according to a fourth modification example. FIG. 28 is a cross-sectional view of the organic EL display device 1 taken along the line XXVIII-XXVIII in FIG. 27.

In the organic EL display device 1 according to the fourth modification example, as illustrated in FIG. 27 and FIG. 28, in order to connect the first frame capacitance electrode 57 and the fourth frame capacitance electrode 131 that constitute the frame capacitor 85, the second opening 133 formed in the third frame capacitance electrode 51 and the second contact hole 135 formed in the gate insulating film 27 inside the second opening 133 are located at a position corresponding to the second dam wall 123, and a plurality of the second openings 133 and a plurality of the second contact holes 135 are formed at intervals from each other along the side of the display region D.

Fifth Modification Example of Second Embodiment

Figure 29:
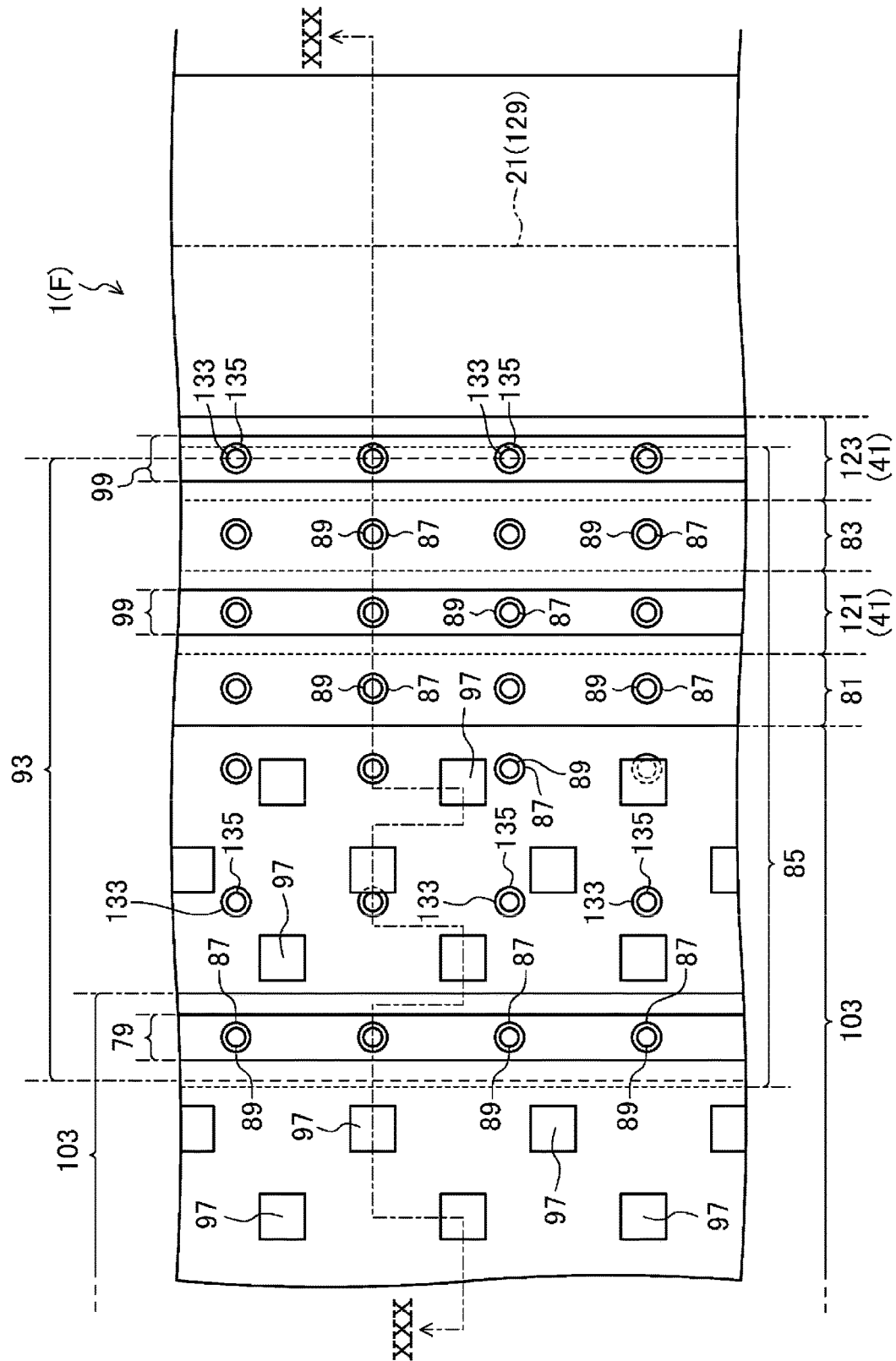
FIG. 29 is a plan view of an organic EL display device according to a fifth modification example of the second embodiment.
Figure 30:
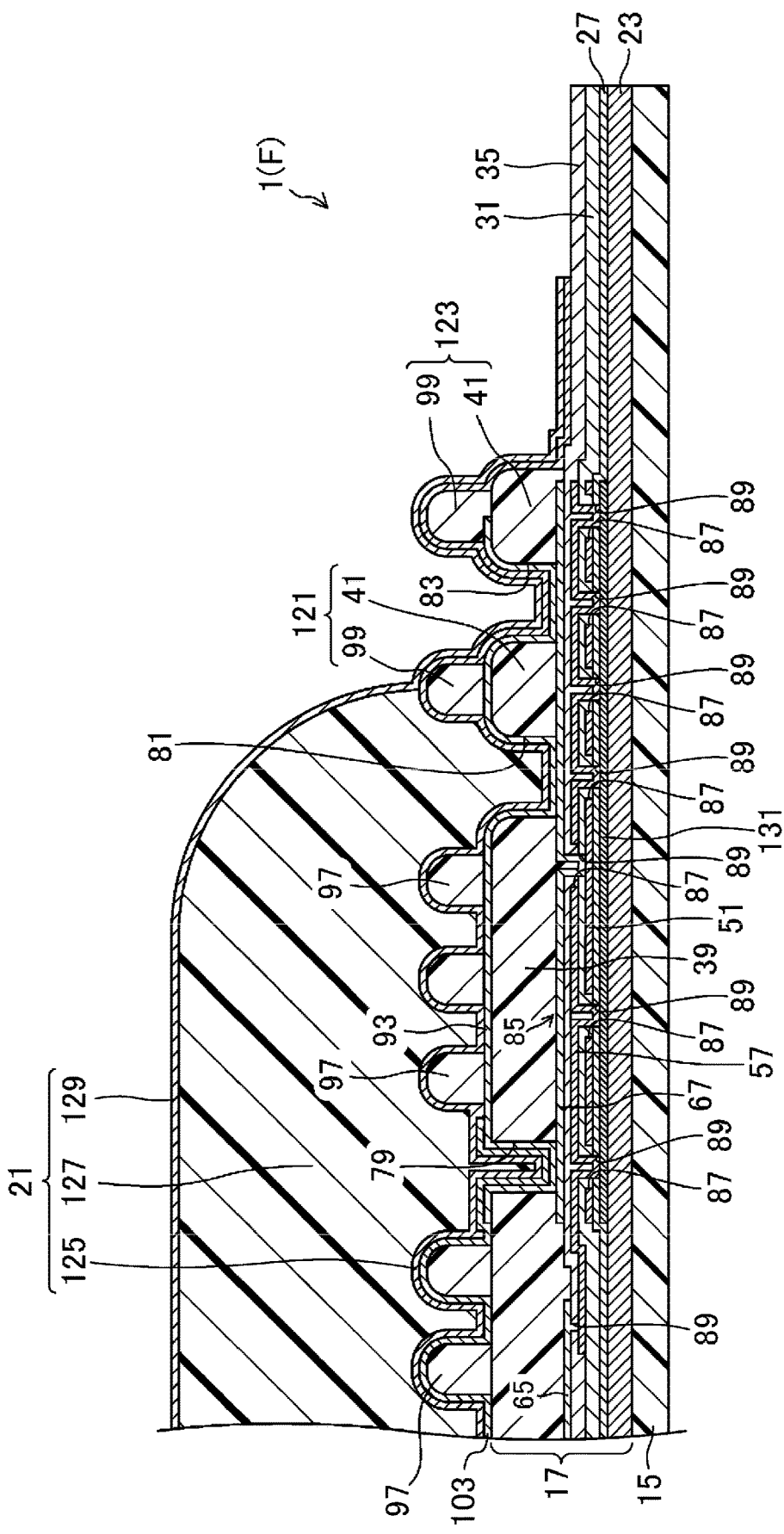
FIG. 30 is a cross-sectional view of the organic EL display device taken along the line XXX-XXX in FIG. 29.

FIG. 29 is a plan view of an organic EL display device 1 in a position corresponding to FIG. 5 according to a fifth modification example. FIG. 30 is a cross-sectional view of the organic EL display device 1 taken along the line XXX-XXX in FIG. 29.

In the organic EL display device 1 according to the fifth modification example, as illustrated in FIG. 29 and FIG. 30, in order to connect the first frame capacitance electrode 57 and the fourth frame capacitance electrode 131 that constitute the frame capacitor 85, the second opening 133 formed in the third frame capacitance electrode 51 and the second contact hole 135 formed in the gate insulating film 27 inside the second opening 133 are located at each of a position corresponding to the outer peripheral portion of the flattening film 39, a position corresponding to the first slit 81, a position corresponding to the first dam wall 121, a position corresponding to the second slit 83, and a position corresponding to the second dam wall 123, and a plurality of the second openings 133 and a plurality of the second contact holes 135 are formed at intervals from each other along the side of the display region D at each position of these.

The forming position of the second contact hole 135 for connecting the first frame capacitance electrode 57 and the fourth frame capacitance electrode 131 in the organic EL display device 1 according to each of the second embodiment and the first to fifth modification examples of the second embodiment described above is merely exemplary, and at least one contact hole 135 may be provided, and can be formed at any position.

In the organic EL display device 1 according to each of the second embodiment and the first to fifth modification examples of the second embodiment, an aspect has been illustrated in which the frame capacitor 85 is provided in a continuation from a position corresponding to the trench 79 to the outer peripheral position of the flattening film 39 (a position corresponding to the first slit 81 and the second slit 83). However, the frame capacitor 85 may be provided separately as the first frame capacitor 85a provided at the outer peripheral position of the flattening film 39 and the second frame capacitor 85b provided at a position corresponding to the trench 79 as in the first embodiment.

Modification Example of First Embodiment and Second Embodiment

Figure 31:
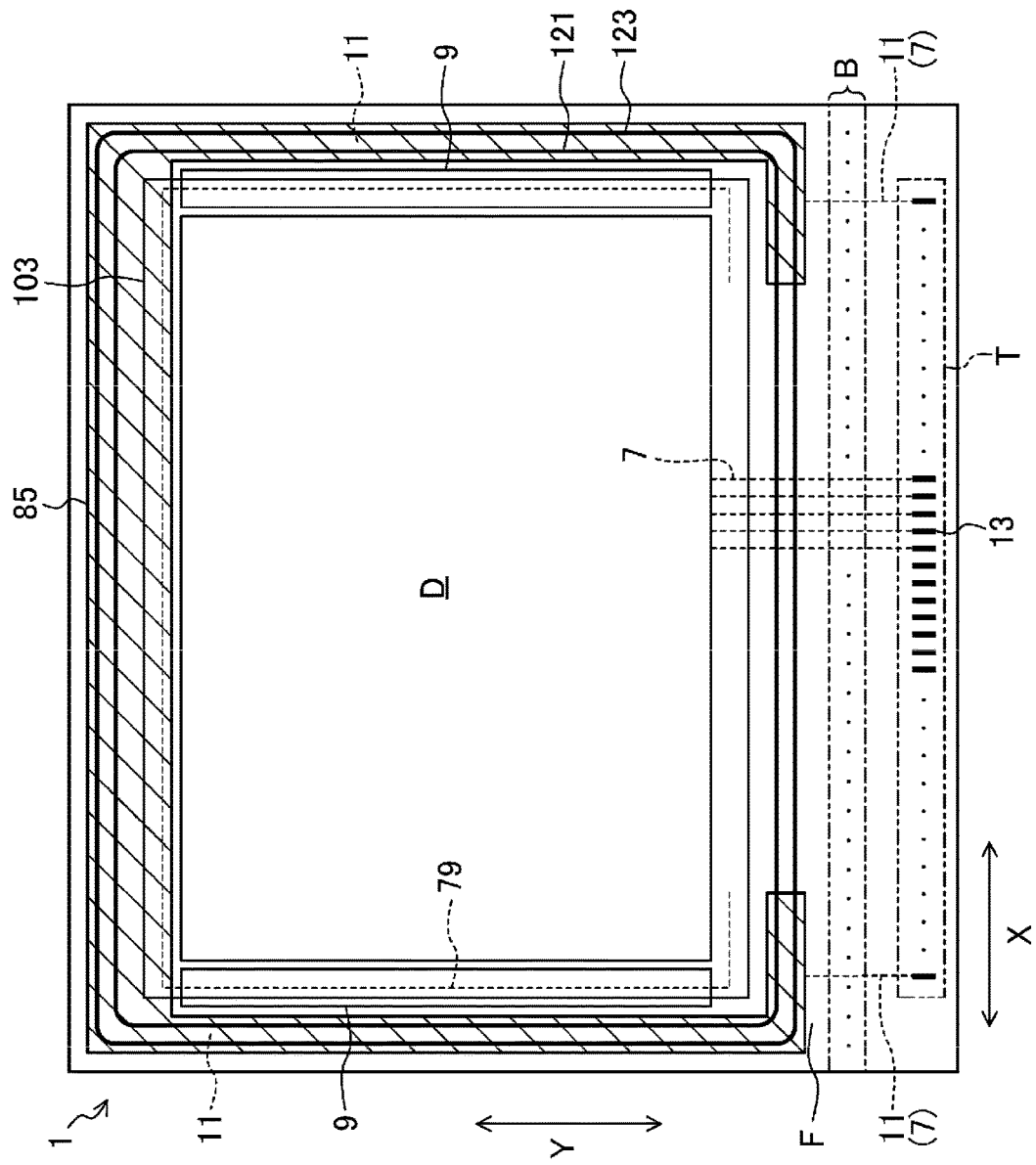
FIG. 31 is a plan view illustrating a schematic configuration of an organic EL display device according to modification examples of the first embodiment and the second embodiment.

FIG. 31 is a plan view illustrating a schematic configuration of an organic EL display device 1 according to the modification example.

In the organic EL display device 1 according to the modification example, as illustrated in FIG. 31, the frame capacitor 85 is provided not only at a portion of the frame region F that constitutes one side located on the opposite side to the terminal portion T with the display region D interposed therebetween, but also at a portion that constitutes two sides adjacent to the side provided with the terminal portion T avoiding the drive circuit 9, to extend along the first dam wall 121 and the second dam wall 123 (hatched portion in FIG. 30). The frame capacitor 85 is also provided on both sides of a portion that constitutes one side provided with the terminal portion T, avoiding the lead-out wiring lines 7 drawn from the display region toward the terminal portion.

According to the organic EL display device 1 according to the modification example, the frame capacitor 85 is provided over a relatively wide range of the frame region F, so the storage capacity of the frame capacitor 85 is increased. This is advantageous for compensating for the voltage that drops due to the IR drop in the voltages applied between the first electrode 91 and the second electrode 103 of the organic EL element 105.

As described above, the preferred embodiments are described as examples of the technique of the present disclosure. However, the technique of the present disclosure is not limited to the embodiments and the modification examples, and is also applicable to an embodiment in which modification, replacement, adding, omission, and the like are suitably made. The constituent elements described in the embodiments described above can be combined into a new embodiment. The constituent elements described in the accompanying drawings and detailed description may also include constituent elements that are not essential for the purpose of solving the problems. As such, those constituent elements that are not essential should not be recognized as being essential immediately as described in the accompanying drawings and detailed description.

For example, the embodiments described above may be configured as follows.

In the organic EL display device 1 according to the first embodiment described above, the frame capacitor 85 includes the first frame capacitance electrode 57, the first interlayer insulating film 31, the second frame capacitance electrode 67, the second interlayer insulating film 35, and the third frame capacitance electrode 51. However, the technique of the present disclosure is not limited to this. The frame capacitor 85 may be constituted only by the first frame capacitance electrode 57, the second interlayer insulating film 35, and the second frame capacitance electrode 67, or may be constituted only by the first frame capacitance electrode 57, the first interlayer insulating film 31, and the third frame capacitance electrode 51.

Each of the first dam wall 121 and the second dam wall 123 is constituted by the layered body of the first wall layer 41 and the second wall layer 99. However, the technique of the present disclosure is not limited to this. Each of the first dam wall 121 and the second dam wall 123 may be constituted only by the first wall layer 41 or the second wall layer 99.

The first dam wall 121 and the second dam wall 123 may employ different configurations from each other. For example, the first dam wall 121 may be constituted only by the first wall layer 41 or the second wall layer 99, and the second dam wall 123 may be constituted by the layered body of the first wall layer 41 and the second wall layer 99. The first dam wall 121 may be constituted by the layered body of the first wall layer 41 and the second wall layer 99, and the second dam wall 123 may be constituted only by the first wall layer 41 or the second wall layer 99.

The organic EL display device 1 has been described by taking as an example a case where the first electrode 91 is the anode electrode and the second electrode 103 is the cathode electrode. However, the technique of the present disclosure is not limited to this. The technique of the present disclosure is also applicable to, for example, the organic EL display device 1 including the organic EL layer 101 including a reversed layered structure in which the first electrode 91 is a cathode electrode and the second electrode 103 is an anode electrode. In this case, the low-level power source wiring line 11 corresponds to the first power source wiring line, and the high-level power source wiring line 65 corresponds to the second power source wiring line.

The organic EL layer 101 is individually provided for each of the subpixels 5. However, the technique of the present disclosure is not limited to this. The organic EL layer 101 may be provided and shared by the plurality of subpixels 5. In this case, the organic EL display device 1 may include a color filter to perform color tone expression of each of the subpixels 5.

The three color subpixels 5 constituting each pixel 3 are provided in a stripe array. However, the technique of the present disclosure is not limited to this. The subpixels 5 constituting each pixel 3 is not limited to three colors, and may be four or more colors. The arrangement of the plurality of subpixels 5 constituting each pixel 3 may be arranged in other arrangements such as a PenTile arrangement.

The first to seventh TFTs 69*a*, 69*b*, 69*c*, 69*d*, 69*e*, 69*f*, and 69*g* employ the top gate structure. However, the technique of the present disclosure is not limited to this. The first TFT to seventh TFT 69*a*, 69*b*, 69*c*, 69*d*, 69*e*, 69*f*, and 69*g* may employ the bottom gate structure. The TFT 69 provided for each of the subpixels 5 may be eight or more, or may be six or less.

In the first embodiment, the organic EL layer 101 of a five-layer layered structure including the hole injection layer 109, the hole transport layer 111, the light-emitting layer 113, the electron transport layer 115, and the electron injection layer 117 is illustrated. However, the technique of the present disclosure is not limited to this. For example, the organic EL layer 101 may adopt a three-layered structure including a hole injection-cum-transport layer, a light-emitting layer, and an electron transport-cum-injection layer, and can adopt any structure.

In the first embodiment described above, the organic EL display device 1 has been described as an example of a display device. However, the technique of the present disclosure is not limited to this. The technique of the present disclosure is applicable to a display device including a plurality of current-driven light-emitting elements, and is also applicable to, for example, a display device including a Quantum-dot Light Emitting Diode (QLED) that is a light-emitting element using a quantum dot-containing layer.

The invention claimed is:

1. A display device comprising:
    a base substrate;
    a thin film transistor layer including a plurality of thin film transistors, the thin film transistor layer being provided on the base substrate; and
    a light-emitting element layer including a plurality of light-emitting elements, the light-emitting element layer being provided on the thin film transistor layer,
    the display device being provided with a display region configured to display an image by light emission of the plurality of light-emitting elements controlled by actions of the plurality of thin film transistors, and a frame region located on a periphery of the display region,
    the light-emitting element layer including first electrodes provided for each of the plurality of light-emitting elements, light-emitting function layers provided on the first electrodes, and a second electrode provided on the light-emitting function layers in common to the plurality of light-emitting elements,
    the thin film transistor layer including a first wiring line, a first interlayer insulating film provided for covering the first wiring line, a second wiring line provided on the first interlayer insulating film, a second interlayer insulating film provided forcovering the second wiring line, and a third wiring line provided on the second interlayer insulating film, at least one wiring line of the first wiring line, the second wiring line, and the third wiring line constituting:

a plurality of first power source wiring lines provided in the display region and electrically connected to the first electrodes via the plurality of thin film transistors, and a second power source wiring line provided in the frame region and electrically connected to the second electrode, the frame region being provided with a terminal portion including terminals configured to, on one side of the display region, supply a first power supply voltage to the plurality of first power source wiring lines and a second power supply voltage different from the first power supply voltage to the second power source wiring line, wherein a frame capacitor is provided in the frame region along a side that is one of two sides facing the terminal portion in the display region, the side being one of the two sides that is farther from the terminal portion, the frame capacitor includes a first capacitance electrode formed by a same material and in a same layer as the second wiring line, and a second capacitance electrode formed by a same material and in a same layer as the third wiring line, the second capacitance electrode facing the first capacitance electrode via the second interlayer insulating film, the first capacitance electrode is electrically connected to the plurality of first power source wiring lines, and the second capacitance electrode is electrically connected to the second power source wiring line;

further comprising:

a sealing film provided for covering the plurality of light-emitting elements, wherein a first dam wall surrounding the display region is provided in the frame region, the sealing film includes an organic layer disposed inside the first dam wall, the thin film transistor layer further includes a flattening film provided for covering the third wiring line, a first slit configured to expose a layer lower than the flattening film, is formed in a frame shape between the flattening film and the first dam wall in the frame region, an intermediate conductive film, in direct contact with the second electrode between the display region and the first slit, is formed in the frame region by a same material and in a same layer as the first electrodes, and the second capacitance electrode is electrically connected to the second electrode via the intermediate conductive film.

2. The display device according to claim 1, The display device according to wherein the frame capacitor is disposed at a position corresponding to the first slit.

3. The display device according to claim 1, wherein the second capacitance electrode and the intermediate conductive film are in contact with each other inside the first slit.

4. The display device according to claim 1,
wherein a second dam wall surrounding the first dam wall is further provided in the frame region,
a second slit configured to expose the layer lower than the flattening film, is provided in a frame shape between the first dam wall and the second dam wall, and
the frame capacitor is disposed at a position corresponding to the second slit.

5. The display device according to claim 1,
wherein a trench extending through the flattening film is formed in a portion of the flattening film between the display region and the first slit, and
the frame capacitor is disposed at a position corresponding to the trench.

6. The display device according to claim 5,
wherein the second capacitance electrode and the intermediate conductive film are in contact with each other inside the trench.

7. The display device according to claim 5,
wherein the frame capacitor is provided continueously from a position corresponding to the trench to a position corresponding to the first slit.

8. The display device according to claim 1,
wherein the frame capacitor further includes a third capacitance electrode facing the second capacitance electrode with the first interlayer insulating film interposed therebetween, and
the third capacitance electrode is formed by a same material and in a same layer as the first wiring line, and is electrically connected to the second capacitance electrode.

9. The display device according to claim 8,
wherein a first opening extending through the first capacitance electrode is formed in the first capacitance electrode,
a first contact hole, extending through the first interlayer insulating film and the second interlayer insulating film inside the first opening, is formed in the first interlayer insulating film and the second interlayer insulating film, and
the second capacitance electrode and the third capacitance electrode are electrically connected to each other via the first contact hole.

10. The display device according to claim 9,
wherein a plurality of the first contact holes is formed at intervals along a side of the display region.

11. The display device according to claim 9,
wherein the first contact hole is located at a position corresponding to the first slit.

12. The display device according to claim 9,
wherein the first contact hole is located at a position corresponding to the first dam wall.

13. The display device according to claim 9,
wherein a trench extending through the flattening film is formed in a portion of the flattening film between the display region and the first slit, and
the first contact hole is located at a position corresponding to the trench.

14. The display device according to claim 9,
wherein the first contact hole is located at a position corresponding to the flattening film.

15. The display device according to claim 8,
wherein the thin film transistor layer further includes a gate insulating film located below the first wiring line, and a semiconductor layer located below the gate insulating film,
the frame capacitor further includes a fourth capacitance electrode facing the third capacitance electrode via the gate insulating film, and
the fourth capacitance electrode is formed by a semiconductor layer formed by a same material and in a same layer as the semiconductor layer being made conductive, and is electrically connected to the first capacitance electrode.

16. The display device according to claim 15,
wherein a second opening extending through the third capacitance electrode is formed in the third capacitance electrode,
a second contact hole, extending through the gate insulating film and the first interlayer insulating film inside the second opening, is formed in the gate insulating film and the first interlayer insulating film, and
the first capacitance electrode and the fourth capacitance electrode are electrically connected to each other via the second contact hole.

17. The display device according to claim 16,
wherein a plurality of the second contact holes is formed at intervals along a side of the display region.

18. The display device according to claim 16,
wherein the second contact hole is located at a position corresponding to the first slit.

19. The display device according to claim 16,
wherein the second contact hole is located at a position corresponding to the first dam wall.

\* \* \* \* \*